US012689391B2

(12) United States Patent (10) Patent No.: US 12,689,391 B2
Tong et al. (45) Date of Patent: Jul. 21, 2026

(54) ENCODING AND DECODING METHOD AND APPARATUS

(71) Applicant: HUAWEI TECHNOLOGIES CO., LTD., Shenzhen (CN)

(72) Inventors: Jiajie Tong, Hangzhou (CN); Xianbin Wang, Hangzhou (CN); Huazi Zhang, Hangzhou (CN); Rong Li, Boulogne Billancourt (FR); Jun Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 182 days.

(21) Appl. No.: 18/399,874

(22) Filed: Dec. 29, 2023

(65) Prior Publication Data

US 2024/0137047 A1 Apr. 25, 2024
US 2024/0235579 A9 Jul. 11, 2024

Related U.S. Application Data

(63) Continuation of application No. PCT/CN2022/097461, filed on Jun. 7, 2022.

(30) Foreign Application Priority Data

Jul. 2, 2021 (CN) .......................... 202110748075.8

(51) Int. Cl.
*H03M 13/13* (2006.01)
*H04L 1/00* (2006.01)
(52) U.S. Cl.
CPC .......... *H03M 13/13* (2013.01); *H04L 1/0057* (2013.01); *H04L 1/0067* (2013.01); *H04L 1/0071* (2013.01)

(58) Field of Classification Search
CPC ............... H03M 13/13; H03M 13/251; H03M 13/6362; H04L 1/0041; H04L 1/0045;
(Continued)

(56) References Cited

U.S. PATENT DOCUMENTS

2015/0194987 A1* 7/2015 Li ........................... H03M 13/13
2017/0214416 A1* 7/2017 Ge .......................... H03M 13/13
(Continued)

FOREIGN PATENT DOCUMENTS

WO 2020135616 A1 7/2020
WO 2021051076 A1 3/2021

OTHER PUBLICATIONS

Kai Chen et al: "An efficient design of bit-interleaved polar coded modulation", 2013 IEEE 24th Annual International Symposium on Personal, Indoor, and Mobile Radio Communications (PIMRC), Sep. 2013, pp. 693-697.
(Continued)

*Primary Examiner* — Albert Decady
*Assistant Examiner* — Enamul M Kabir
(74) *Attorney, Agent, or Firm* — HAUPTMAN HAM, LLP

(57) ABSTRACT

An encoding method, a decoding method, and an apparatus. A symbol quantity S is determined based on an encoding bit quantity L and an energy level quantity B, where S is S1 or S2, S1=L/B, and S2=L/2B. K information sub-channels are determined from an encoding sequence based on the symbol quantity S, the energy level quantity B, and a reliability sequence. K information bits are encoded and a bit sequence is output based on the K information sub-channels, where the K information sub-channels are selected from candidate sub-channels based on an order of reliability of the candidate sub-channels. The candidate sub-channels are S1 sub-chan-
(Continued)

nels or 2×S2 sub-channels in a sub-sequence whose energy level is i in the encoding sequence.

20 Claims, 12 Drawing Sheets

(58) Field of Classification Search
CPC ... H04L 1/0057; H04L 1/0058; H04L 1/0067;
H04L 1/0071
See application file for complete search history.

(56) References Cited

U.S. PATENT DOCUMENTS

| | | | | |
|---|---|---|---|---|
| 2018/0278369 A1* | 9/2018 | Ge | ........................ | H04L 1/0041 |
| 2018/0331783 A1* | 11/2018 | Ahn | ........................ | H04L 27/18 |
| 2020/0067533 A1* | 2/2020 | Wang | ................ | H03M 13/2778 |
| 2021/0036805 A1* | 2/2021 | Kim | ................... | H03M 13/251 |
| 2022/0345242 A1* | 10/2022 | Hong | ................... | H04L 1/0009 |
| 2024/0154719 A1* | 5/2024 | Xu | ........................ | H04L 1/0041 |

OTHER PUBLICATIONS

Seidl, Mathis, et al: "Polar-coded modulation", IEEE Transactions on Communications vol. 61, Issue: 10, Sep. 16, 2013, pp. 4108-4119.
Extended European Search Report issued in corresponding European Application No. 22831636.0, dated Sep. 11, 2024, pp. 1-8.

* cited by examiner

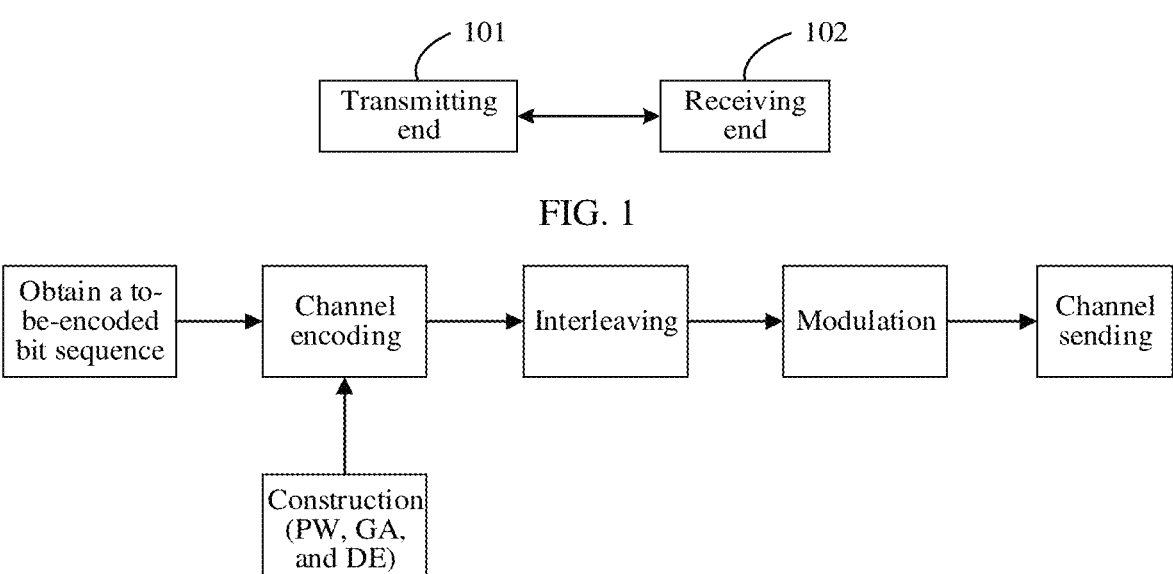
FIG. 1
FIG. 2
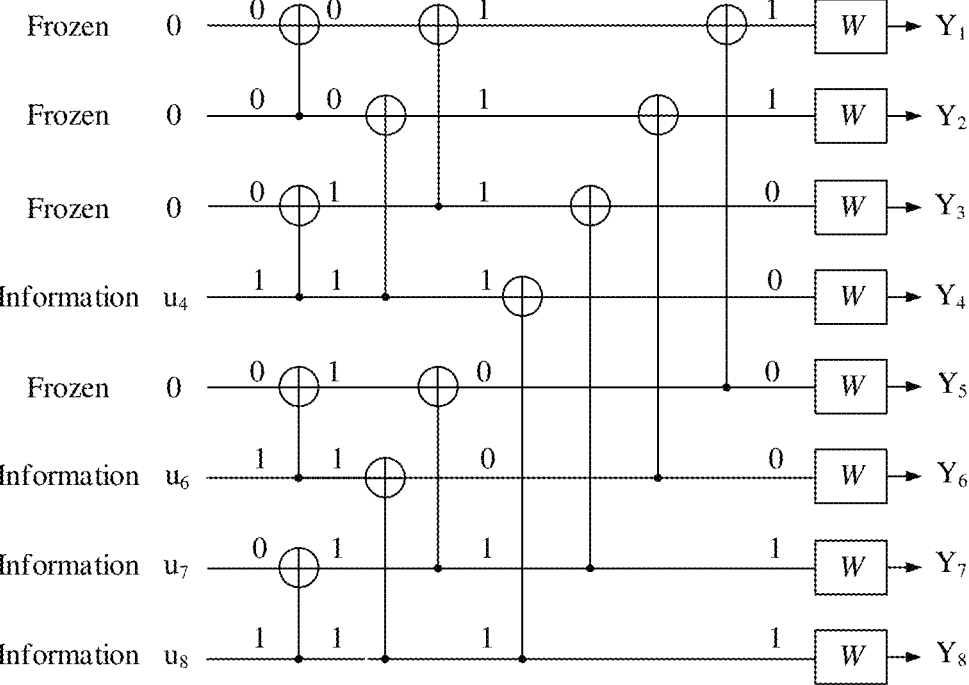
FIG. 3

Probability density functions corresponding
to a0, a1, a2, and a3 are correlated Probability density functions corresponding
to c0, c1, c2, and c3 are correlated

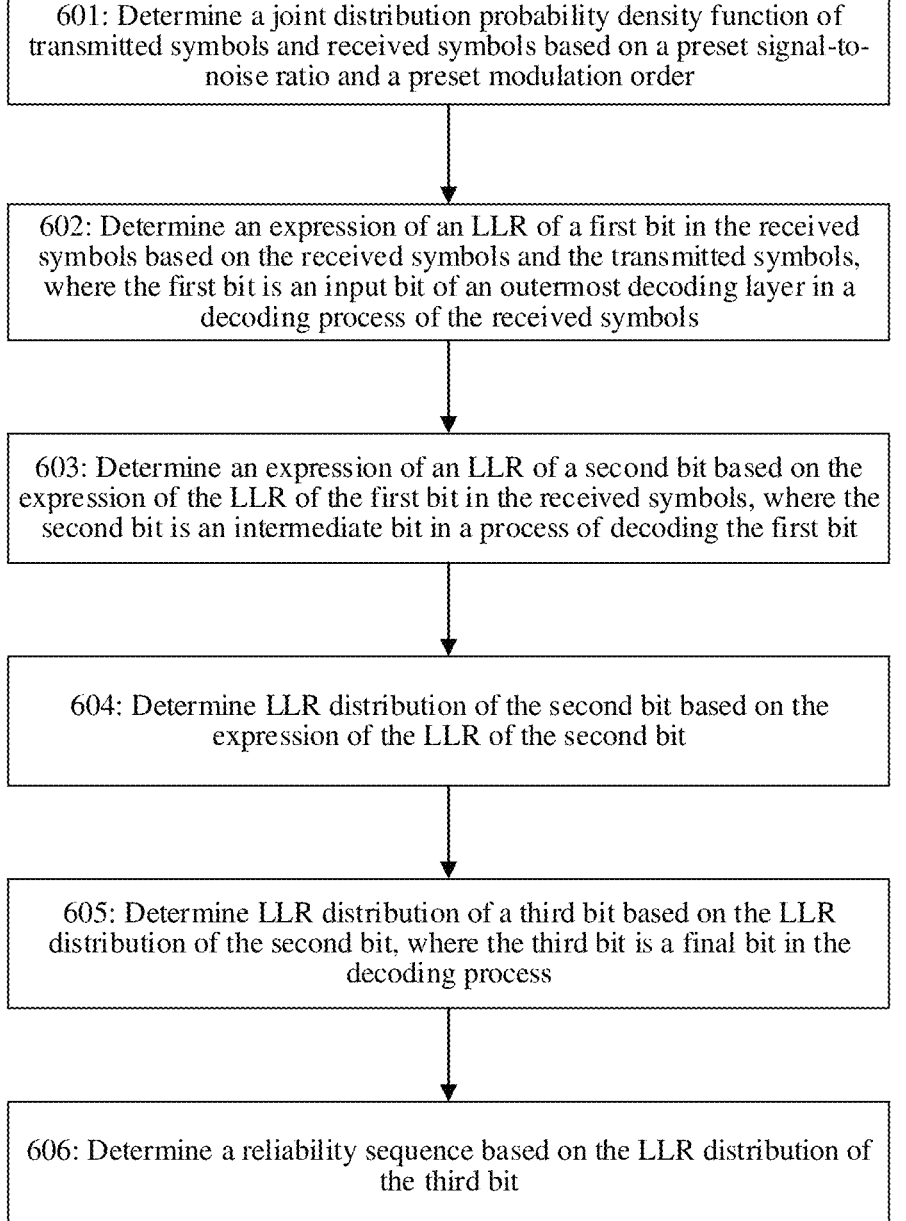

601: Determine a joint distribution probability density function of transmitted symbols and received symbols based on a preset signal-to-noise ratio and a preset modulation order 602: Determine an expression of an LLR of a first bit in the received symbols based on the received symbols and the transmitted symbols, where the first bit is an input bit of an outermost decoding layer in a decoding process of the received symbols 603: Determine an expression of an LLR of a second bit based on the expression of the LLR of the first bit in the received symbols, where the second bit is an intermediate bit in a process of decoding the first bit 604: Determine LLR distribution of the second bit based on the expression of the LLR of the second bit 605: Determine LLR distribution of a third bit based on the LLR distribution of the second bit, where the third bit is a final bit in the decoding process 606: Determine a reliability sequence based on the LLR distribution of the third bit

FIG. 6

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 16 | 17 | 18 | 19 | 20 | 21 | 22 | 23 | 24 | 25 | 26 | 27 | 28 | 29 | 30 | 31 |
| 32 | 33 | 34 | 35 | 36 | 37 | 38 | 39 | 40 | 41 | 42 | 43 | 44 | 45 | 46 | 47 |
| 48 | 49 | 50 | 51 | 52 | 53 | 54 | 55 | 56 | 57 | 58 | 59 | 60 | 61 | 62 | 63 |

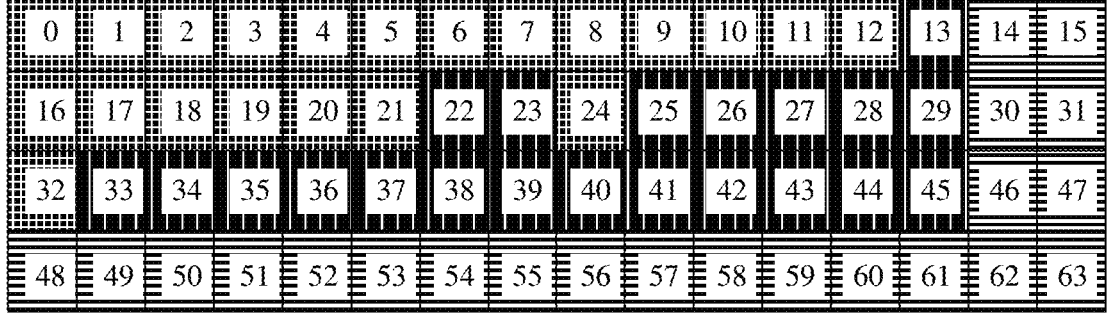
 Pattern 1     Pattern 2    Pattern 3
FIG. 9

ENCODING AND DECODING METHOD AND APPARATUS

CROSS-REFERENCE TO RELATED APPLICATIONS

This application is a continuation of International Patent Application No. PCT/CN2022/097461, filed on Jun. 7, 2022, which claims priority to Chinese Patent Application No. 202110748075.8, filed on Jul. 2, 2021. The disclosures of the aforementioned applications are hereby incorporated by reference in their entireties.

BACKGROUND

The most typical three communication scenarios of a 5th generation (5G) communication system include an enhanced mobile broadband (eMBB), massive machine type communication (mMTC), and ultra-reliable low-latency communication (URLLC). As a most basic radio access technology, encoding is one of important research objects to meet a 5G communication usage standards. A polar code is selected as a control encoding scheme in a 5G standard. The polar code is also referred to as a Polar code, and is the first and only known encoding method that is strictly proved to "achieve" a channel capacity. For different code lengths, particularly for limited codes, performance of the polar code is much better than that of a turbo code and a low density parity check (LDPC) code. In addition, the polar code has low computational complexity in encoding and decoding. The advantages enable the polar code to have a great development and application prospect in 5G.

In a polar code encoding process, an information sub-channel is first determined, and then a to-be-encoded bit sequence is encoded based on the information sub-channel. Currently, a common construction method is, for example, bit-interleaved coded modulation (BICM). The BICM mainly constructs an information sub-channel based on lower-order modulation such as quadrature phase shift keying (QPSK) or binary phase shift keying (BPSK). In a construction process, energy of all bits in a symbol is consistent. However, in higher-order modulation such as pulse amplitude modulation (PAM) 16, energy of four bits included in one symbol is inconsistent. In response to the BICM being used for generating a polar code under the higher-order modulation, there is a problem that a construction result does not match a modulation scheme.

Currently, a polar code generation manner applicable to the higher-order modulation is to be urgently provided.

SUMMARY

At least one embodiment provides an encoding method, a decoding method, and an apparatus, to generate a polar code that matches higher-order modulation.

According to a first aspect, at least one embodiment provides an encoding method. The method is performed by a communication apparatus. The communication apparatus is, for example, a terminal device, a network device, or an Internet of Things device, or is a module (for example, a chip) in a network device, or is a module (for example, a chip) in a terminal device. An entity for executing the method is not limited herein in at least one embodiment, and the encoding method provided in at least one embodiment is performed provided that a transmitter is disposed in a communication device.

The encoding method includes: obtaining an information bit quantity K and an encoding bit quantity L; determining a symbol quantity S based on the encoding bit quantity L and an energy level quantity B, where S is S1 or S2, $S1=L/B$, and $S2=L/2B$; determining K information sub-channels from an encoding sequence based on the symbol quantity S, the energy level quantity B, and a reliability sequence; and encoding K information bits and outputting a bit sequence based on the K information sub-channels, where the encoding sequence includes Bmax sub-sequences, the Bmax sub-sequences respectively correspond to Bmax energy levels, each sub-sequence in the Bmax sub-sequences includes Smax sub-channels, and the reliability sequence indicates an order of reliability of sub-channels in the encoding sequence; the K information sub-channels are selected from candidate sub-channels based on an order of reliability of the candidate sub-channels, and the candidate sub-channels are S1 sub-channels or 2×S2 sub-channels in a sub-sequence whose energy level is i; and K, L, B, S, S1, S2, Bmax, and Smax are all positive integers, Smax is greater than or equal to S, Bmax is greater than or equal to B, and i is greater than or equal to 0 and less than B.

In the foregoing technical solution, the reliability sequence is constructed based on correlation between bits in a same symbol, and in a construction process, different energy levels of different bits in the same symbol are further considered. In response to sending information, a transmitting end determines the information sub-channel from the encoding sequence based on the reliability sequence, and the transmitting end encodes the information bit based on the determined information sub-channel, to obtain a bit sequence that matches higher-order modulation. Correspondingly, a receiving end determines the information sub-channel from the encoding sequence based on the reliability sequence, and decode the bit sequence based on the information sub-channel, to obtain information that is to be actually sent by the transmitting end. In this manner, a coding gain of about 0.5 dB to 1.5 dB is increased. In addition, designs of an encoder and a decoder are able to not be changed. This helps reduce costs.

In addition, the reliability sequence is a double nested structure, to be specific, a sequence including Smax×Bmax sub-channels that jointly correspond to the preset symbol quantity Smax and the preset energy level quantity Bmax. The reliability sequence is applicable to different symbol quantities or different energy levels. The transmitting end determines the candidate sub-channels based on a symbol quantity and an energy level corresponding to a to-be-sent information bit and the reliability sequence. Then, the information sub-channel and a frozen sub-channel are determined from the candidate sub-channels. In this way, different reliability sequences for modulation corresponding to each energy level quantity able to not be set. This helps reduce costs.

In at least one embodiment, the K information sub-channels are selected in a descending order of reliability from sub-channels that are other than a punctured sub-channel, a shortened sub-channel, and a pre-frozen sub-channel and that are in the candidate sub-channels.

In the foregoing technical solution, the punctured sub-channel, the shortened sub-channel, and the pre-frozen sub-channel are excluded from the candidate sub-channels, and the information sub-channels are selected from remaining candidate sub-channels in descending order of reliability, to ensure that reliability of all sub-channels used for carrying the information bit is high, and help improve accuracy in information transmission.

In at least one embodiment, the punctured sub-channel or the shortened sub-channel is determined based on the energy level quantity B and a mother code length in a symbol corresponding to the energy level quantity B.

In the foregoing technical solution, the mother code length in the symbol is determined based on an energy level (namely, a bit quantity in the symbol). In other words, the mother code length is determined from two dimensions: an inter-symbol dimension and an intra-symbol dimension, to help determine a candidate sub-channel corresponding to the energy level quantity B and the symbol quantity S.

In at least one embodiment, after the encoding K information bits and outputting a bit sequence based on the K information sub-channels, the method further includes: performing rate matching and modulation on the output bit sequence to obtain S to-be-sent symbols; and performing interleaving processing on the S to-be-sent symbols.

In the foregoing technical solution, the symbol-level interleaving processing is performed on the modulated S to-be-sent symbols, to ensure that correlation among a plurality of bits in the symbols is not damaged, and help improve anti-interference performance of the to-be-sent symbols in response to burst continuous noise in a sending process.

In at least one embodiment, the modulation includes: sequentially selecting one bit from each sub-sequence of B sub-sequences in an ascending order of energy levels and mapping the bit to one to-be-sent symbol. In at least one embodiment, a $(j_1 \times B + j_2)^{th}$ bit in the bit sequence is mapped to a $j_2^{th}$ bit in a $j_1^{th}$ to-be-sent symbol, where $j_1$ is a positive integer less than S, and $j_2$ is a positive integer less than B.

In at least one embodiment, for quadrature amplitude modulation (QAM) 256, the modulation further includes: exchanging mapping orders of a bit selected from a sub-sequence corresponding to a third energy level and a bit selected from a sub-sequence corresponding to a fourth energy level in the ascending order of energy levels.

In the foregoing technical solution, the mapping orders of the bit selected from the sub-sequence corresponding to the third energy level and the bit selected from the sub-sequence corresponding to the fourth energy level are exchanged to obtain a symbol. This helps improve transmission performance of the symbol in a channel.

In at least one embodiment, the encoding is polar code encoding.

According to a second aspect, at least one embodiment provides a decoding method. The method is performed by a communication apparatus. The communication apparatus is, for example, a terminal device, a network device, or an Internet of Things device, or is a module (for example, a chip) in a network device, or is a module (for example, a chip) in a terminal device. An entity for executing the method is not limited herein in at least one embodiment, and the decoding method provided in at least one embodiment is performed provided that a receiver is disposed in a communication device.

The decoding method includes: receiving S symbols, where a symbol quantity S is S1 or S2; and demodulating and decoding the S symbols based on the symbol quantity S, an energy level quantity B, a reliability sequence, and an encoding sequence to obtain L bits, where the L bits include K information bits, and L=S1×B, or L=2×S2×B, where the encoding sequence includes Bmax sub-sequences, the Bmax sub-sequences respectively correspond to Bmax energy levels, each sub-sequence in the Bmax sub-sequences includes Smax sub-channels, and the reliability sequence indicates an order of reliability of sub-channels in the encoding sequence; the K information sub-channels are selected from candidate sub-channels based on an order of reliability of the candidate sub-channels, and the candidate sub-channels are S1 sub-channels or 2×S2 sub-channels in a sub-sequence whose energy level is i; and K, L, B, S, S1, S2, Bmax, and Smax are all positive integers, Smax is greater than or equal to S, Bmax is greater than or equal to B, and i is greater than or equal to 0 and less than B.

In the foregoing technical solution, the reliability sequence is constructed based on correlation between bits in a same symbol, and in a construction process, different energy levels of different bits in the same symbol are further considered. In response to sending information, a transmitting end determines the information sub-channel from the encoding sequence based on the reliability sequence, and the transmitting end encodes the information bit based on the determined information sub-channel, to obtain a bit sequence that matches higher-order modulation. Correspondingly, a receiving end determines the information sub-channel from the encoding sequence based on the reliability sequence, and decode the bit sequence based on the information sub-channel, to obtain information that is to be actually sent by the transmitting end. In addition, designs of an encoder and a decoder are able to not be changed. This helps reduce costs.

In addition, the reliability sequence is a double nested structure, to be specific, a sequence including Smax×Bmax sub-channels that jointly correspond to the preset symbol quantity Smax and the preset energy level quantity Bmax. The reliability sequence is applicable to different symbol quantities or different energy levels. The transmitting end determines the candidate sub-channels based on a symbol quantity and an energy level corresponding to a to-be-sent information bit and the reliability sequence. Then, the information sub-channel and a frozen sub-channel are determined from the candidate sub-channels. In this way, different reliability sequences for modulation corresponding to each energy level quantity are able to not be set. This helps reduce costs.

In at least one embodiment, the K information sub-channels are selected in a descending order of reliability from sub-channels that are other than a punctured sub-channel, a shortened sub-channel, and a pre-frozen sub-channel and that are in the candidate sub-channels.

In at least one embodiment, the punctured sub-channel or the shortened sub-channel is determined based on an energy level quantity B and a mother code length in a symbol corresponding to the energy level quantity B.

In at least one embodiment, before the demodulating and decoding the S symbols based on the symbol quantity S, the energy level quantity B, a reliability sequence, and an encoding sequence to obtain L bits, the method further includes: performing de-interleaving processing on the S symbols.

In at least one embodiment, the demodulation includes: sequentially mapping B bits included in each symbol in the S symbols to B sub-sequences sorted in ascending order of energy levels.

In at least one embodiment, for QAM256, the demodulation further includes: exchanging mapping orders of a third bit and a fourth bit included in each symbol in the S symbols.

In at least one embodiment, the encoding is polar code decoding.

According to a third aspect, at least one embodiment provides a communication apparatus. The communication apparatus is, for example, a terminal device, a network device, or an Internet of Things device, or is a module (for example, a chip) in a network device, or is a module (for example, a chip) in a terminal device. The communication apparatus includes an input/output unit and a processing unit.

In at least one embodiment, the input/output unit is configured to obtain an information bit quantity K and an encoding bit quantity L; and the processing unit is configured to determine a symbol quantity S based on the encoding bit quantity L and an energy level quantity B, where S is S1 or S2, $S1=L/B$, and $S2=L/2B$, where the processing unit is further configured to: determine K information sub-channels from an encoding sequence based on the symbol quantity S, the energy level quantity B, and a reliability sequence; and the processing unit is further configured to encode K information bits and output a bit sequence based on the K information sub-channels, where the encoding sequence includes Bmax sub-sequences, the Bmax sub-sequences respectively correspond to Bmax energy levels, each sub-sequence in the Bmax sub-sequences includes Smax sub-channels, and the reliability sequence indicates an order of reliability of sub-channels in the encoding sequence; the K information sub-channels are selected from candidate sub-channels based on an order of reliability of the candidate sub-channels, and the candidate sub-channels are S1 sub-channels or $2\times S2$ sub-channels in a sub-sequence whose energy level is i; and K, L, B, S, S1, S2, Bmax, and Smax are all positive integers, Smax is greater than or equal to S, Bmax is greater than or equal to B, and i is greater than or equal to 0 and less than B.

In at least one embodiment, the K information sub-channels are selected in a descending order of reliability from sub-channels that are other than a punctured sub-channel, a shortened sub-channel, and a pre-frozen sub-channel and that are in the candidate sub-channels.

In at least one embodiment, the punctured sub-channel or the shortened sub-channel is determined based on the energy level quantity B and a mother code length in a symbol corresponding to the energy level quantity B.

In at least one embodiment, after encoding the K information bits and outputting a bit sequence based on the K information sub-channels, the processing unit is further configured to: perform rate matching and modulation on the output bit sequence to obtain S to-be-sent symbols; and perform interleaving processing on the S to-be-sent symbols.

In at least one embodiment, the processing unit is configured to sequentially select one bit from each sub-sequence of B sub-sequences in an ascending order of energy levels and map the bit to one to-be-sent symbol.

In at least one embodiment, for QAM256, the processing unit is further configured to exchange mapping orders of a bit selected from a sub-sequence corresponding to a third energy level and a bit selected from a sub-sequence corresponding to a fourth energy level in the ascending order of energy levels.

In at least one embodiment, the encoding is polar code encoding.

According to a fourth aspect, at least one embodiment provides a communication apparatus. The communication apparatus is, for example, a terminal device, a network device, or an Internet of Things device, or is a module (for example, a chip) in a network device, or is a module (for example, a chip) in a terminal device. The communication apparatus includes an input/output unit and a processing unit.

In at least one embodiment, the input/output unit is configured to receive S symbols, where a symbol quantity S is S1 or S2; and the processing unit is configured to: demodulate and decode the S symbols based on the symbol quantity S, an energy level quantity B, a reliability sequence, and an encoding sequence to obtain L bits, where the L bits include K information bits, and $L=S1\times B$, or $L=2\times S2\times B$, where the encoding sequence includes Bmax sub-sequences, the Bmax sub-sequences respectively correspond to Bmax energy levels, each sub-sequence in the Bmax sub-sequences includes Smax sub-channels, and the reliability sequence indicates an order of reliability of sub-channels in the encoding sequence; the K information sub-channels are selected from candidate sub-channels based on an order of reliability of the candidate sub-channels, and the candidate sub-channels are S1 sub-channels or $2\times S2$ sub-channels in a sub-sequence whose energy level is i; and K, L, B, S, S1, S2, Bmax, and Smax are all positive integers, Smax is greater than or equal to S, Bmax is greater than or equal to B, and i is greater than or equal to 0 and less than B.

In at least one embodiment, the K information sub-channels are selected in a descending order of reliability from sub-channels that are other than a punctured sub-channel, a shortened sub-channel, and a pre-frozen sub-channel and that are in the candidate sub-channels.

In at least one embodiment, the punctured sub-channel or the shortened sub-channel is determined based on an energy level quantity B and a mother code length in a symbol corresponding to the energy level quantity B.

In at least one embodiment, before demodulating and decoding the S symbols based on the symbol quantity S, the energy level quantity B, the reliability sequence, and the encoding sequence to obtain the L bits, the processing unit is further configured to perform de-interleaving processing on the S symbols.

In at least one embodiment, the processing unit is configured to sequentially map B bits included in each symbol in the S symbols to B sub-sequences sorted in ascending order of energy levels.

In at least one embodiment, for QAM256, the processing unit is further configured to exchange mapping orders of a third bit and a fourth bit included in each symbol in the S symbols.

In at least one embodiment, the encoding is polar code decoding.

For the third aspect or the fourth aspect, the input/output unit is referred to as a transceiver unit, a communication unit, or the like. In response to the communication apparatus being a terminal device, the input/output unit is a transceiver, and the processing unit is a processor. In response to the communication apparatus being a module (for example, a chip) in a terminal device, the input/output unit is an input and output interface, an input and output circuit, an input and output pin, or the like, or is referred to as an interface, a communication interface, an interface circuit, or the like. The processing unit is a processor, a processing circuit, a logic circuit, or the like.

According to a fifth aspect, at least one embodiment provides a communication apparatus, including at least one processor and a memory. The memory is configured to store a computer program or instructions. In response to the communication apparatus running, the processor executes the computer program or the instructions stored in the memory, so that the communication apparatus performs the method according to the first aspect, or performs the method according to the second aspect. In an optional implementation, the processor and the memory is integrated into a same chip, or is separately integrated into different chips.

According to a sixth aspect, at least one embodiment further provides a computer-readable storage medium. The computer-readable storage medium stores computer-readable instructions, and in response to the computer-readable instructions being run on a computer, the computer is enabled to perform the method according to the first aspect, or perform the method according to the second aspect.

According to a seventh aspect, at least one embodiment provides a computer program product including instructions. In response to the computer program product running on a computer, the computer is enabled to perform the method according to the first aspect, or perform the method according to the second aspect.

According to an eighth aspect, at least one embodiment provide a chip system. The chip system includes a processor, and further includes a memory, and is configured to implement the method according to the first aspect, or configured to perform the method according to the second aspect. The chip system includes a chip, or includes a chip and another discrete component.

According to a ninth aspect, embodiments described herein provide a communication system. The communication system includes a transmitting end and a receiving end, where the transmitting end is configured to perform the method according to the first aspect, and the receiving end is configured to perform the method according to the second aspect.

For technical effects that is achieved by the second aspect to the ninth aspect, refer to descriptions of technical effects that is achieved by corresponding implementations in the first aspect. Details are not described herein again.

BRIEF DESCRIPTION OF DRAWINGS

FIG. 1 is an example of a communication system applicable to a polar encoding method and a polar decoding method according to at least one embodiment;

FIG. 2 is a schematic flowchart of an example of sending a signal by a transmitting end according to at least one embodiment;

FIG. 3 is an example of a specific encoding process according to at least one embodiment;

FIG. 6 is a schematic flowchart of an example of determining a reliability sequence according to at least one embodiment;

FIG. 9 is a schematic diagram of an example of constructing an information sub-channel and a frozen sub-channel according to at least one embodiment;

DESCRIPTION OF EMBODIMENTS

Figure 4:
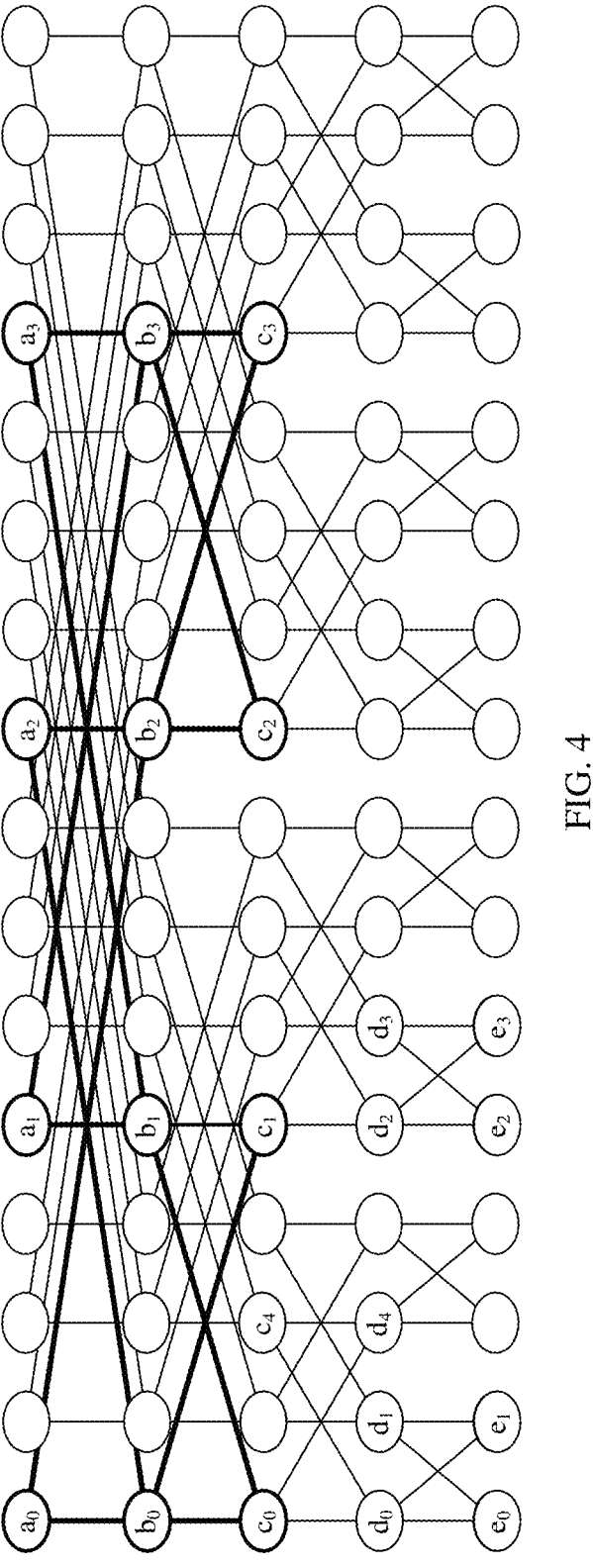
FIG. 4 is a schematic diagram of an example of decoding a plurality of bits in a received symbol by a receiving end according to at least one embodiment.

In the field of wireless communication technologies, a communication device (for example, a terminal device or a network device) performs encoding in a polar code manner. A polar code is designed based on channel polarization, and is the first constructive encoding scheme that is proved through a strict mathematical method to achieve a channel capacity.

The wireless communication field includes but is not limited to a 5G communication system, a future communication system (such as a 6G communication system), a satellite communication system, a narrowband Internet of Things (NB-IoT) system, a global system for mobile communications (GSM), an enhanced data rate for GSM evolution (EDGE) system, a wideband code division multiple access (WCDMA) system, a code division multiple access 2000 (CDMA2000) system, a time division-synchronous code division multiple access (TD-SCDMA) system, a long term evolution (LTE) system, and three typical application scenarios of the 5G mobile communication system: eMBB, URLLC, and mMTC.

FIG. 1 is an example of a communication system applicable to a polar encoding method and a polar decoding method according to at least one embodiment. The communication system includes a transmitting end 101 and a receiving end 102. The transmitting end 101 is a network device or a terminal device, and the receiving end 102 is a network device or a terminal device.

Optionally, in response to the transmitting end 101 being the network device, the receiving end 102 is the terminal device; or in response to the receiving end 102 being the network device, the transmitting end 101 is the terminal device.

The transmitting end 101 includes an encoder. The transmitting end 101 encodes a to-be-encoded bit sequence by using the encoder, and output an encoded bit sequence. A to-be-sent symbol is obtained through rate matching, interleaving, and modulation performed on the encoded bit sequence, and the to-be-sent symbol is transmitted to the receiving end 102 on a channel. The receiving end 102 includes a decoder. The receiving end 102 receives and demodulate the symbol from the transmitting end 101. After performing demodulation and de-interleaving on the received symbol, the receiving end 102 performs decoding by using the decoder.

A terminal device in at least one embodiment includes a device that provides a voice and/or data connectivity for a user. The terminal device includes a device that provides a voice for the user, includes a device that provides data connectivity for the user, or includes a device that provides a voice and data connectivity for the user. For example, the terminal device includes a handheld device with a wireless connection function, or a processing device connected to a wireless modem. The terminal device includes user equipment (UE), a wireless terminal device, a mobile terminal device, a device-to-device (D2D) communication terminal device, a vehicle-to-everything (V2X) terminal device, a machine-to-machine/machine-type communication (M2M/MTC) terminal device, an Internet of Things (IoT) terminal device, a subscriber unit, a subscriber station, a mobile station (mobile station), a remote station, an access point (AP), a remote terminal device, an access terminal device, a user terminal device, a user agent, a user device, a satellite, a drone, a balloon, an airplane, or the like. For example, the terminal device includes a mobile phone (or referred to as a "cellular" phone), a computer with a mobile terminal device, or a portable, pocket-sized, handheld, or computer built-in mobile apparatus. For example, the terminal device is a device such as a personal communication service (PCS) phone, a cordless telephone set, a session initiation protocol (SIP) phone, a wireless local loop (WLL) station, or a personal digital assistant (PDA). The terminal device alternatively includes a limited device, for example, a device with low power consumption, a device with a limited storage capability, or a device with a limited computing capability. For example, the terminal device includes an information sensing device such as a barcode, radio frequency identification (RFID), a sensor, a global positioning system (GPS), or a laser scanner. As an example instead of a limitation, in at least one embodiment, the terminal device alternatively is a wearable device. The wearable device is also referred to as a wearable intelligent device, an intelligent wearable device, or the like, and is a general term of wearable devices that are intelligently designed and developed for daily wear by using a wearable technology. In response to the various terminal devices described above being located in a vehicle (for example, placed in the vehicle or installed in the vehicle), the terminal devices is all considered as vehicle-mounted terminal devices. For example, the vehicle-mounted terminal devices are also referred to as on-board units (OBU).

The network device in at least one embodiment includes, for example, an access network (AN) device such as a base station (for example, an access point), and is a device that is in an access network and that communicates with a wireless terminal device over an air interface through one or more cells. Alternatively, a network device is, for example, a road side unit (RSU) in a vehicle-to-everything (V2X) technology. For example, the network device includes a next-generation NodeB (gNB) in a 5G mobile communication technology and a new radio (NR) system (also referred to as an NR system for short), or includes a central unit (CU) and a distributed unit (DU) in a cloud access network (Cloud RAN) system, a satellite, a drone, a balloon, an airplane, and the like. This is not limited in at least one embodiment.

A polar code is a linear block code. A generator matrix of the polar code is $G_N$, and an encoding process of the polar code is $$x_1^N = u_1^N G_N,$$

where $$u_1^N = (u_1, u_2, \ldots, u_N),$$

and is a binary row vector, and a length is N (namely, a code length); and $G_N$ is an N×N matrix, and $$G_N = F_2^{\otimes(log_2(N))},$$

where $$F_2 = \begin{bmatrix} 1 & 0 \\ 1 & 1 \end{bmatrix},$$

and $$F_2^{\otimes(log_2(N))}$$

is defined as a Kronecker product of $log_2$ N matrices $F_2$.

In a polar code encoding process, some bits in $$u_1^N$$

are used for carrying information and are referred to as information bits, and a set of indexes of the bits is denoted as A. Some other bits are set to fixed values that are pre-agreed on by a transmitting end and a receiving end (where the bits are referred to as fixed bits or frozen bits), and a set of indexes of the bits is represented by a complementary set $A^c$ of A. Generally, the fixed bits are usually set to 0. A sequence of the fixed bits is randomly set provided that the transmitting end and the receiving end reach an agreement in advance. Therefore, encoding output of the polar code is simplified as:

$$x_1^N = u_A G_N(A),$$

where $u_A$ is a set of the information bits in $$u_1^N,$$

$u_A$ is a row vector with a length of K, that is, |A|=K, where |•| represents a quantity of elements in the set, K is an information block size, $G_N(A)$ is a sub-matrix obtained by using rows corresponding to indexes in the set A in the matrix $G_N$, and $G_N(A)$ is a K×N matrix. A polar code construction process is a selection process of the set A, and the selection process of the set A determines performance of the polar code.

Refer to FIG. 2. An example of a process of sending a signal by a transmitting end is illustrated. The transmitting end constructs an information sub-channel and a frozen sub-channel in advance based on manners such as density evolution (DE), Gaussian approximation (GA), and polarization weight (PW). Channel encoding is performed on a to-be-encoded bit sequence based on the constructed information sub-channel and frozen sub-channel, to obtain an encoded bit sequence. Because energy of bits in a modulation symbol is inconsistent, the encoded bit sequence is input to an interleaver to perform interleaving. An interleaved bit sequence is modulated into a plurality of symbols. The transmitting end sends the symbol to a receiving end.

FIG. 3 shows an example of a specific encoding process. The left side is understood as a to-be-encoded side, and the right side is understood as an encoded side. A process from left to right is a process in which a transmitting end encodes a to-be-encoded bit sequence. On the to-be-encoded side, the to-be-encoded bit sequence is represented by a vector u, where the vector u is (0, 0, 0, u4, 0, u6, u7, u8). The vector u is encoded based on a generator matrix $G_N$, to obtain an encoded bit sequence. Refer to FIG. 3. The encoded bit sequence is represented as (1, 1, 0, 0, 0, 0, 1, 1), where a high-reliability sub-channel is used for mapping an information bit, and a low-reliability sub-channel is used for mapping a frozen bit. As shown in FIG. 3, four information bits are respectively mapped to information sub-channels, frozen sub-channels are set to 0, and a bit sequence with a length of 8 is generated after an encoding process $$x_1^N = u_1^N G_N.$$

Further description is made with reference to FIG. 3. In the encoding process, two adjacent columns are an encoding layer, bits in a left column are input bits of the encoding layer, and bits in a right column are output bits of the encoding layer. For example, in the leftmost encoding layer, an input bit sequence is (0, 0, 0, 1, 0, 1, 0, 1), and an output bit sequence is (0, 0, 1, 1, 1, 1, 1, 1). An operation symbol "$\oplus$" in the middle of the encoding layer represents an exclusive OR operation, "$\oplus$" represents an exclusive OR operation between a bit in a row in which "$\oplus$" is located and a bit in a row which "$\oplus$" reaches, and a bit on the right side of "$\oplus$" is an operation result. For example, in the leftmost encoding layer, a "$\oplus$" operation is performed on the first input bit (with a value of 0) and the second input bit (with a value of 0) to obtain the first output bit (with a value of 0).

Currently, a common construction method is, for example, BICM. The BICM mainly constructs an information sub-channel based on lower-order modulation such as QPSK or BPSK. In a construction process, energy of bits in a lower-order modulation symbol is consistent. However, in higher-order modulation, for example, QAM16, energy of bits in a symbol is inconsistent. In response to the BICM being used for generating a polar code under the higher-order modulation, there is a problem that a constructed information sub-channel does not match a modulation scheme.

In view of this, at least one embodiment provides an encoding method, a decoding method, and an apparatus, to construct an information sub-channel and a frozen sub-channel by using correlation between bits in a symbol under the higher-order modulation, and generate a polar code under the higher-order modulation based on the constructed information sub-channel and frozen sub-channel. This helps improve channel transmission reliability.

The correlation between a plurality of bits in a same symbol under the higher-order modulation is explained in advance.

In response to a transmitting end sending the symbol to a receiving end through a channel, the plurality of bits in the same symbol are subject to same noise interference in the channel. Distribution of received information of the plurality of bits in the same symbol received by the receiving end is correlated. FIG. 4 is a schematic diagram of decoding a plurality of bits in a received symbol by a receiving end, where a modulation scheme is, for example, amplitude shift keying (ASK) 16, and four bits in one symbol are correlated.

In FIG. 4, $a_0$, $a_1$, $a_2$, $a_3$, $b_0$, $b_1$, $b_2$, $b_3$, and the like all represent bits, and each bit corresponds to a value of the bit. In a decoding process, a plurality of times of decoding is included, each time of decoding corresponds to one decoding layer, and one decoding layer includes an input bit and an output bit. For example, at the outermost decoding layer, the receiving end decodes $a_0$, $a_1$, $a_2$, and $a_3$ to obtain $b_0$, $b_1$, $b_2$, and $b_3$, where $a_0$, $a_1$, $a_2$, and $a_3$ are the input bits, and $b_0$, $b_1$, $b_2$, and $b_3$ are the output bits. For ease of description, a layer at which $a_0$, $a_1$, $a_2$, and $a_3$ are located is referred to as a first layer, a layer at which $b_0$, $b_1$, $b_2$, and $b_3$ are located is referred to as a second layer, a layer at which $c_0$, $c_1$, $c_2$, and $c_3$ are located is referred to as a third layer, the first layer and the second layer form a first decoding layer, the second layer and the third layer form a second decoding layer, and so on.

In the example shown in FIG. 4, the receiving end receives four symbols, and each symbol includes four bits. In other words, the receiving end receives a bit sequence including 16 bits. Further, $a_0$, $a_1$, $a_2$, and $a_3$ in the bit sequence are all bits in the first symbol. In a sending process, because $a_0$, $a_1$, $a_2$, and $a_3$ are subject to same noise interference in a same symbol (namely, the first symbol), $a_0$, $a_1$, $a_2$, and $a_3$ are correlated.

Correspondingly, the receiving end decodes $a_0$, $a_1$, $a_2$, and $a_3$ in the first symbol to obtain intermediate results, where the intermediate results are respectively $b_0$, $b_1$, $b_2$, and $b_3$. Because $b_0$, $b_1$, $b_2$, and $b_3$ still correspond to the first symbol, and are subject to the same noise interference in the same symbol, $b_0$, $b_1$, $b_2$, and $b_3$ are correlated.

The receiving end continues to decode $b_0$, $b_1$, $b_2$, and $b_3$ to obtain intermediate results, where the intermediate results are respectively $c_0$, $c_1$, $c_2$, and $c_3$. Because $c_0$, $c_1$, $c_2$, and $c_3$ still correspond to the first symbol, and are subject to the same noise interference in the same symbol, $c_0$, $c_1$, $c_2$, and $c_3$ are correlated.

Figure 5A:
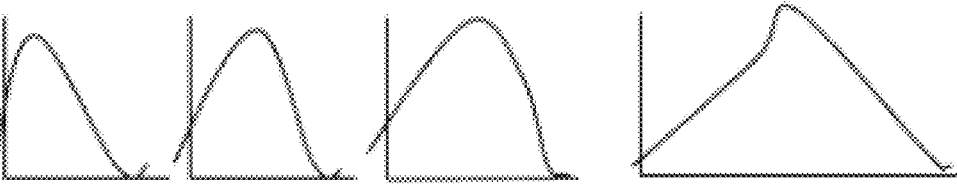
FIG. 5a and FIG. 5b are schematic diagrams of examples of bit correlation in a group of symbols according to at least one embodiment.
Figure 5B:
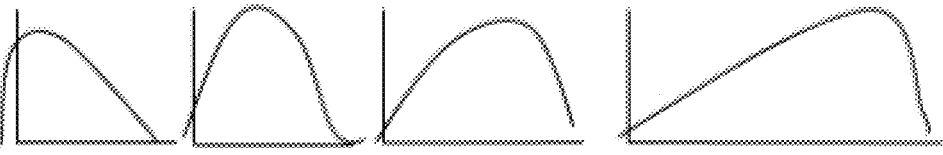

Herein, the receiving end performs two-layer decoding on $a_0$, $a_1$, $a_2$, and $a_3$ in the first symbol, to obtain $c_0$, $c_1$, $c_2$, and $c_3$. For probability density functions respectively corresponding to $a_0$, $a_1$, $a_2$, and $a_3$, refer to FIG. 5a. The probability density functions respectively corresponding to $a_0$, $a_1$, $a_2$, and $a_3$ are correlated. For probability density functions respectively corresponding to $c_0$, $c_1$, $c_2$, and $c_3$, refer to FIG. 5b. The probability density functions respectively corresponding to $c_0$, $c_1$, $c_2$, and $c_3$ are also correlated.

As shown in FIG. 4, the receiving end continues to decode $c_0$, $c_1$, $c_2$, and $c_3$, to obtain intermediate decoding results. A correspondence between bits at all layers in FIG. 4 that bits obtained by decoding $c_0$, $c_1$, $c_2$, and $c_3$ no longer correspond to a same symbol, that is, the obtained bits are no longer correlated.

Based on the foregoing descriptions of the correlation, at least one embodiment provides a manner of constructing a reliability sequence. The reliability sequence is obtained based on the correlated plurality of bits in the same symbol in the foregoing decoding process.

In construction of the reliability sequence, a preset symbol quantity Smax and a preset modulation order Bmax is determined in advance, and both Smax and Bmax are positive integers. The preset modulation order indicates a quantity of bits included in one symbol, and a plurality of bits in one symbol respectively correspond to respective energy levels. In at least one embodiment, values of the preset modulation order, a preset bit quantity, and a preset energy level quantity are the same, and the three is interchanged in some embodiments.

A schematic flowchart of generating a reliability sequence is described with reference to FIG. 6. The procedure is performed by a reliability sequence generation apparatus, and the reliability sequence generation apparatus is a receiving end, a transmitting end, or another apparatus.

Step 601: Determine a joint distribution probability density function of transmitted symbols and received symbols based on a preset signal-to-noise ratio and a preset modulation order, where the transmitted symbol is represented as x, the received symbol is represented as y, and the joint distribution probability density function of the transmitted symbols and the received symbols is represented as f(y, x).

In at least one embodiment, a quantity of transmitted symbols is equal to the preset symbol quantity Smax, and a quantity of received symbols is also equal to the preset symbol quantity Smax. In other words, the joint distribution probability density function of the transmitted symbols and the received symbols is determined based on Smax transmitted symbols and Smax received symbols.

For example, the joint distribution probability density function of the transmitted symbols and the received symbols f(y, x) meets a formula:

$$f(y,x)=X(x,\sigma^2)\times P(x)$$

$x_0, x_1, \ldots, x_{max-1}$ are a value range of a value of the transmitted symbol, and the value range of the value of the transmitted symbol is related to the preset modulation order Bmax. For example, in a case of ASK8, the preset modulation order is 3, and the value range of the value of the transmitted symbol is $x_0, x_1, \ldots, x_7$. For example, in a case of ASK16, the preset modulation order is 4, and the value range of the value of the transmitted symbol is $x_0, x_1, \ldots, x_{15}$. $X(x, \sigma^2)$ is Gaussian distribution that complies with $N(x, \sigma^2)$, and $\sigma^2$ is noise power density. $P(x)$ is a prior probability that an amplitude of the transmitted symbol is equal to $x_0, x_1, \ldots, x_{max-1}$.

Step 602: Determine an expression of an LLR of a first bit in the received symbols based on the received symbols and the transmitted symbols.

The first bit is an input bit of the outermost decoding layer in a decoding process of the received symbols. A same received symbol includes Bmax first bits, and the Bmax first bits is respectively represented as $a_0, a_1, \ldots, a_{Bmax-1}$. For example, in the ASK16 shown in FIG. 4, there are four received symbols, and the outermost decoding layer corresponding to each received symbol includes four first bits. The first received symbol is used as an example for description. The four first bits included in the first received symbol is respectively represented as $a_0, a_1, a_2$, and $a_3$.

The transmitted symbol is a joint expression of a plurality of bits, and the transmitted symbol is expressed as $(b_0 b_1, \ldots b_{Bmax-1})_2$ in binary, where $b_0, b_1, \ldots, b_{Bmax-1}$ are values of all bits of the transmitted symbol in a binary expression.

A prior probability $P(\tilde{x})$ is determined first, and a likelihood probability $P(y|\tilde{x})$ is determined based on the received symbols, where $\tilde{x}$ is a transmitted symbol in response to the likelihood probability being calculated. Then, expressions of LLRs of a plurality of first bits are determined based on the prior probability $P(\tilde{x})$ and the likelihood probability $P(y|\tilde{x})$.

For example, in the plurality of first bits, an LLR of a $k^{th}$ first bit is expressed as:

$$LLR_k(y, x) = \log\frac{\sum_{\tilde{b}_k=\tilde{b}_k} P(y|\tilde{x})\times P(\tilde{x})}{\sum_{\tilde{b}_k!=\tilde{b}_k} P(y|\tilde{x})\times P(\tilde{x})}$$

A value range of k is $0, 1, \ldots, B_{max-1}$; $b_k$ is a value of the $k^{th}$ first bit in x; and $\tilde{b}_k$ is a value of the $k^{th}$ first bit in $\tilde{x}$.

In a construction process, $LLR_k(y, x)$ is used to represent whether the $k^{th}$ first bit is correctly decoded. For example, in response to the LLR being greater than 0, the $k^{th}$ first bit is correctly decoded; or in response to the LLR being less than 0, the $k^{th}$ first bit is incorrectly decoded. A probability that the $k^{th}$ first bit is correctly decoded is obtained based on an integral of a (y, x) combination with $LLR_k(y, x)$ greater than 0 in f(y, x).

In at least one embodiment, the receiving end receives Smax received symbols, and each received symbol includes Bmax first bits. To be specific, a bit sequence received by the receiving end includes Nmax first bits, where Nmax equals to the preset symbol quantity Smax multiplied by the preset modulation order Bmax. Correspondingly, the receiving end determines LLRs of the Nmax first bits, that is, expressions of the LLRs of the Nmax first bits with respect to (y, x). In the example in FIG. 4, the preset symbol quantity Smax is 4, and the preset modulation order Bmax is 4. In other words, the bit sequence received by the receiving end includes 16 first bits. Correspondingly, the receiving end obtains expressions of LLRs of the 16 first bits with respect to (y, x) based on the 16 (y, x) combinations.

Step 603: Determine an expression of an LLR of a second bit based on the expression of the LLR of the first bit in the received symbol. The second bit is an intermediate bit in a process of decoding the first bit.

For any received symbol, the expression of the LLR of the second bit is determined based on the expression of the LLR of the first bit in the received symbol. One received symbol includes Bmax first bits. LLRs of the Bmax first bits in the received symbol are decoded, to obtain LLRs of Bmax second bits, and the Bmax second bits also correspond to the received symbol. In at least one embodiment, the Bmax second bits is respectively represented as $c_0, c_1, \ldots,$ and $c_{Bmax-1}$.

For example, in the ASK16 shown in FIG. 4, symbol decoding operation is performed on LLRs (to be specific, LLRs of $a_0, a_1, a_2$, and $a_3$) in the four first bits in the first received symbol, to obtain LLRs in four second bits corresponding to the first received symbol. The four second bits is respectively represented as $c_0, c_1, c_2$, and $c_3$.

An example in which $a_0, a_1, a_2$, and $a_3$ are first bits, and $c_0, c_1, c_2$, and $c_3$ are second bits is used for explaining a process of determining expressions of LLRs of the second bits based on expressions of the LLRs of the first bits in at least one embodiment.

Step 1: Obtain expressions of LLRs of $b_0, b_1, b_2$, and $b_3$ based on the expressions of the LLRs of $a_0, a_1, a_2$, and $a_3$.

For example, the expressions of the LLRs of $b_0, b_1, b_2$, and $b_3$ is as follows:

$$LLR_{b_0}(y,x)=(LLR_{a_0}(y,x)\blacksquare LLR_{a_2}(y,x))$$

$$LLR_{b_1}(y,x)=(LLR_{a_1}(y,x)\blacksquare LLR_{a_3}(y,x))$$

$$LLR_{b_2}(y,x)=(LLR_{a_0}(y,x)+LLR_{a_2}(y,x))$$

$$LLR_{b_3}(y,x)=(LLR_{a_1}(y,x)+LLR_{a_3}(y,x))$$

In the expression, $LLR_{a_0}(y, x)$, $LLR_{a_1}(y, x)$, $LLR_{a_2}(y, x)$, and $LLR_{a_3}(y, x)$ indicate the expressions of the LLRs of $a_0$, $a_1$, $a_2$, and $a_3$ respectively; and $LLR_{b_0}(y, x)$, $LLR_{b_1}(y, x)$, $LLR_{b_2}(y, x)$, and $LLR_{b_3}(y, x)$ indicate the expressions of the LLRs of $b_0, b_1, b_2$, and $b_3$ respectively. $\blacksquare$ indicates a boxplus operation. For example, boxplus is also replaced by an expression $a\blacksquare b=(1-2^{sign(a)^{sign(b)}})\times min(abs(a), abs(b))$. In the expression, sign indicates a sign operation, 0 is output for a positive number, and 1 is output for a negative number. abs indicates an operation of obtaining an absolute value, and min indicates an operation of obtaining a minimum value.

Step 2: Obtain the expressions of the LLRs of $c_0$, $c_1$, $c_2$, and $c_3$ based on the expressions of the LLRs of $b_0$, $b_1$, $b_2$, and $b_3$.

For example, the expressions of the LLRs of $c_0$, $c_1$, $c_2$, and $c_3$ is as follows:

$$LLR_{c_0}(y,x)=(LLR_{b_0}(y,x)\blacksquare LLR_{b_1}(y,x))$$

$$LLR_{c_1}(y,x)=(LLR_{b_0}(y,x)+LLR_{b_1}(y,x))$$

$$LLR_{c_2}(y,x)=(LLR_{b_2}(y,x)\blacksquare LLR_{b_3}(y,x))$$

$$LLR_{c_3}(y,x)=(LLR_{b_2}(y,x)+LLR_{b_3}(y,x))$$

In the expression, $LLR_{c_0}(y, x)$, $LLR_{c_1}(y, x)$, $LLR_{c_2}(y, x)$, and $LLR_{c_3}(y, x)$ indicate the LLRs of $c_0$, $c_1$, $c_2$, and $c_3$ respectively.

Further, based on the expressions of the LLRs of $c_0$, $c_1$, $c_2$, and $c_3$ with respect to the LLRs of $b_0$, $b_1$, $b_2$, and $b_3$ and the expressions of the LLRs of $b_0$, $b_1$, $b_2$, and $b_3$ with respect to the LLRs of $a_0$, $a_1$, $a_2$, and $a_3$, the expressions of the LLRs of $c_0$, $c_1$, $c_2$, and $c_3$ with respect to the LLRs of $a_0$, $a_1$, $a_2$, and $a_3$ is obtained:

$$LLR_{c_0}(y,x)=(LLR_{a_0}(y,x)\blacksquare LLR_{a_1}(y,x))*(LLR_{a_1}(y,x)\\ \blacksquare LLR_{a_3}(y,x))$$

$$LLR_{c_1}(y,x)=(LLR_{a_0}(y,x)\blacksquare LLR_{a_1}(y,x))+(LLR_{a_1}(y,x)\\ *LLR_{a_3}(y,x))$$

$$LLR_{c_2}(y,x)=(LLR_{a_0}(y,x)+LLR_{a_2}(y,x))\blacksquare(LLR_{a_1}(y,x)+\\ LLR_{a_3}(y,x))$$

$$LLR_{c_3}(y,x)=(LLR_{a_0}(y,x)+LLR_{a_2}(y,x))+(LLR_{a_1}(y,x)+\\ LLR_{a_3}(y,x))$$

The foregoing descriptions are merely provided by using the ASK16 as an example. However, in another scenario, for example, ASK4 or ASK8, the expressions of the LLRs of the second bits is also determined based on the expressions of the LLRs of the first bits.

For example, in the ASK8:

$$LLR_{c_0}(y,x)=(LLR_{a_0}(y,x)\blacksquare LLR_{a_2}(y,x))\blacksquare(LLR_{a_1}(y,x))$$

$$LLR_{c_1}(y,x)=(LLR_{a_0}(y,x)\blacksquare LLR_{a_2}(y,x))+(LLR_{a_1}(y,x))$$

$$LLR_{c_2}(y,x)=(LLR_{a_0}(y,x)+LLR_{a_2}(y,x))$$

In the ASK16 or the ASK8, two-layer decoding is to be performed on the LLRs of the first bits, to obtain the LLRs of the second bits. However, in the ASK4, the LLRs of the second bits is obtained by performing only one-layer decoding on the LLRs of the first bits. In other words, in at least one embodiment, a decoding layer quantity for decoding from the LLRs of the first bits to the LLRs of the second bits (which is referred to as a first decoding layer quantity) is related to a preset modulation order. For example, the first decoding layer quantity equals to $\log_2$ Bmax. For example, the preset modulation order is 4, and the first decoding layer quantity is 2; or the preset modulation order is 2, and the first decoding layer quantity is 1.

In at least one embodiment, the receiving end determines expressions of LLRs of Nmax second bits, to be specific, the expressions of the LLRs of the Nmax second bits with respect to (y, x). In the example in FIG. 4, the preset symbol quantity Smax is 4, and the preset modulation order Bmax is 4. In other words, the bit sequence received by the receiving end includes 16 second bits. Correspondingly, the receiving end obtains expressions of LLRs of the 16 second bits with respect to (y, x) based on 16 (y, x) combinations.

Step 604: Determine LLR distribution of the second bits based on the expressions of the LLRs of the second bits.

The LLR distribution of the second bits is obtained based on the following expression:

$$f_c(LLR=L)=\int_{LLR_c(y,x)=L}f(y,x)$$

$f_c(LLR=L)$ is the LLR distribution of the second bits. Thus, the LLR distribution of the second bits is a distribution function related to the LLRs of the second bits. In at least one embodiment, LLR distribution of the Nmax second bits is obtained.

Step 605: Determine LLR distribution of third bits based on the LLRs distribution of the second bits.

The third bit is a final bit (equivalent to a to-be-encoded bit of the transmitting end) in the decoding process, and the plurality of third bits is used by the receiving end to determine information bits actually sent by the transmitting end. For example, in the ASK16 shown in FIG. 4, the last layer is final bits obtained through decoding, and the final bits include 16 third bits.

For a co-color block, LLR distribution of two output bits in the co-color block is determined based on LLR distribution of two input bits in the co-color block. Still using FIG. 4 as an example, LLR distribution of $d_0$ and $d_4$ is determined based on LLR distribution of $c_0$ and $c_4$. For details, refer to the following relational expression:

$$f_{d_0}(LLR=L)=\int_{L=L_0\blacksquare L_4}f_{c_0}(L_0)\times f_{c_4}(L_4)$$

$$f_{d_4}(LLR=L)=\int_{L=L_0+L_4}f_{c_0}(L_0)\times f_{c_4}(L_4)$$

$f_{c_0}(L)$ and $f_{c_4}(L)$ are the LLR distribution of $c_0$ and $c_4$ respectively, and $f_{d_0}(L)$ and $f_{d_4}(L)$ are the LLR distribution of $d_0$ and $d_4$ respectively.

In this way, LLR distribution of bits at a fourth layer in the decoding process is obtained based on LLR distribution of bits at a third layer in the decoding process. Further, LLR distribution of bits at a fifth layer in the decoding process is determined based on the LLR distribution of the bits at the fourth layer in the decoding process, and by analogy, LLR distribution of bits at the last layer in the decoding process (that is, the LLR distribution of the third bits) is obtained.

In at least one embodiment, LLR distribution of Nmax third bits is obtained.

In the decoding process, the LLR distribution of the third bits is determined based on the LLR distribution of the second bits, where a decoding layer quantity is related to the preset symbol quantity Smax. In other words, a decoding layer quantity for decoding from the second bits to the third bits (which is referred to as a second decoding layer quantity) is related to the preset symbol quantity Smax. For example, the second decoding layer quantity equals to $\log_2$ Smax. For example, the preset symbol quantity is 4, and the second decoding layer quantity is 2; or the preset symbol quantity is 8, and the second decoding layer quantity is 3.

Step 606: Determine a reliability sequence based on the LLR distribution of the third bits.

The following is performed on each of the Nmax third bits: Perform integration on a part that is in the LLR distribution of the third bits and whose LLR is greater than 0, to obtain decoding accuracy of the third bits.

Optionally, the decoding accuracy of the third bits is obtained with reference to the relational expression $P_u=\int_{L>0}f_u(L)$, where u represents the third bits, $f_u(L)$ represents the LLR distribution of the third bits, and $P_u$ represents the decoding accuracy of the third bits.

After the accuracy of the third bits is determined, reliability of the third bits is determined based on the accuracy of the third bits. For example, the accuracy of the third bits is used as the reliability of the third bits. Then, a reliability sequence is determined based on reliability of the Nmax third bits. In determining the reliability sequence, the Nmax third bits is sorted based on the reliability respectively corresponding to the Nmax third bits, to obtain the reliability sequence.

With reference to the method for determining the reliability sequence shown in the example in FIG. 6, in at least one embodiment, a joint probability density function f(y, x) corresponding to a bit is converted into discrete probability distribution, and an actual operation is completed in a manner of probability distribution summation. For ease of description, the example of the ASK16 shown in FIG. 4 is still used for description.

Step 1: Perform discretization processing on the received symbols to obtain discretized values $\acute{y}$, where $\acute{y}$ has $2n+1$ items, and is represented as $[\acute{y}_{-n}, \acute{y}_{-(n-1)}, \ldots, \acute{y}_{-1}, \acute{y}_0, \acute{y}_1, \ldots, \acute{y}_{(n-1)}, \acute{y}_n]$, and n is a positive integer. Further, $\acute{y}_i=i \times z$, $i \in [-n, -(n-1), \ldots, -1, 0, 1, \ldots, n-1, n]$, where z represents a positive number.

Then, the probability density function f(y, x) is converted into a discrete probability distribution $$P(\acute{y}_1, x) = P(x) \times \int_{\acute{y}_a}^{\acute{y}_b} X(x, \sigma^2),$$

where $x_0, x_1 \ldots, x_{max-1}$ is a value range of a value of a transmitted symbol, $$\acute{y}_a = \begin{cases} -\infty, & i = -n \\ z \times (i - 0.5), & i \neq -n \end{cases}, \acute{y}_b = \begin{cases} +\infty, & i = n \\ z \times (i + 0.5), & i \neq n \end{cases},$$

and P(x) is a prior probability that the transmitted symbol is equal to $x_0, x_1 \ldots, x_{max-1}$.

Step 2: Determine a likelihood probability $P(\acute{y}|\tilde{x})$ based on the received symbol $\acute{y}$, and determine the expressions of the LLRs of the first bits in the received symbol $\acute{y}$ based on the likelihood probability $P(\acute{y}|\tilde{x})$ and the prior probability $P(\tilde{x})$.

The LLR of the $k^{th}$ first bit is expressed as $$LLR_k(\acute{y}, x) = \log \frac{\sum_{b_k = \tilde{b}_k} P(\acute{y}|\tilde{x}) \times P(\tilde{x})}{\sum_{b_k! = \tilde{b}_k} P(\acute{y}|\tilde{x}) \times P(\tilde{x})},$$

where the value of k is one of 0, 1, 2, or 3; $b_k$ is the value of the $k^{th}$ first bit in x; and $\tilde{b}_k$ is the value of the $k^{th}$ first bit in $\tilde{x}$. To facilitate calculation, the foregoing expression $LLR_k(\acute{y}, x)$ is simplified as follows:

$$LLR_k(\acute{y},x)=\max_{b_k=\tilde{b}_k}(P(\acute{y}|\tilde{x}) \times P(\tilde{x}))-\max_{b_k!=\tilde{b}_k}(P(\acute{y}|\tilde{x}) \times P(\tilde{x}))$$

The max operation indicates obtaining the maximum value.

Correspondingly, the receiving end obtains the expressions of the LLRs of the 16 first bits with respect to (y, x) based on the 16 (y, x) combinations.

Step 3: Determine the expressions of the LLRs of the second bits based on the expressions of the LLRs of the first bits in the received symbol y, including the following step.

Based on the expressions of the LLRs of $a_0$, $a_1$, $a_2$, and $a_3$, the obtained expressions of the LLRs of $c_0$, $c_1$, $c_2$, and $c_3$ is as follows:

$$LLR_{c_0}(\acute{y},x)=(LLR_{a_0}(\acute{y},x) \blacksquare LLR_{a_2}(\acute{y},x)) \blacksquare (LLR_{a_1}(\acute{y},x) \blacksquare LLR_{a_3}(\acute{y},x)))$$

$$LLR_{c_1}(\acute{y},x)=(LLR_{a_0}(\acute{y},x) \blacksquare LLR_{a_1}(\acute{y},x))+(LLR_{a_1}(\acute{y},x) \blacksquare LLR_{a_3}(\acute{y},x)))$$

$$LLR_{c_2}(\acute{y},x)=(LLR_{a_0}(\acute{y},x)+LLR_{a_2}(\acute{y},x)) \blacksquare (LLR_{a_1}(\acute{y},x)+LLR_{a_3}(\acute{y},x)))$$

$$LLR_{c_3}(\acute{y},x)=(LLR_{a_0}(\acute{y},x)+LLR_{a_2}(\acute{y},x))+(LLR_{a_1}(\acute{y},x)+LLR_{a_3}(\acute{y},x)))$$

$\blacksquare$ represents the boxplus operation, and consistent with Gaussian approximation, the LLRs is represented by correct decoding and incorrect decoding in this case, so that a G function is simplified to addition. To simplify the calculation, the boxplus alternatively is replaced by an expression $a \blacksquare b = (1 - 2^{sign(a)^*sign(b)}) \times \min(abs(a), abs(b))$. In the expression, sign indicates a sign operation, 0 is output for a positive number, and 1 is output for a negative number. abs indicates an operation of obtaining an absolute value, and min indicates an operation of obtaining a minimum value.

Step 4: Determine the LLR distribution of the second bits based on the expressions of the LLRs of the second bits.

LLR distribution of any second bit is represented as $P_c(LLR=\acute{L})=\Sigma_{LLR_c(\acute{y}_1,x)=L} P(\acute{y}_1, x)$, where $\acute{L}$ is a discretized value of the LLR. $\acute{L}$ has $2m+1$ items, and is represented as $[\acute{L}_{-m}, \acute{L}_{-(m-1)}, \ldots, \acute{L}_{-1}, \acute{L}_0, \acute{L}_1, \ldots, \acute{L}_{(m-1)}, \acute{L}_m]$, and m is a positive integer. $\acute{L}_i=i \times z$, $i \in [-m, -(m-1), \ldots, -1, 0, 1, \ldots, m-1, m]$.

Step 5: Determine the LLR distribution of the third bits based on the LLR distribution of the second bits.

Density evolution is performed on a basic in the co-color block, to obtain output distribution of $P_{d_0}(\acute{L})$ and $P_{d_4}(\acute{L})$ in response to distribution of $P_{c_0}(\acute{L})$ and $P_{c_4}(\acute{L})$ being input, and an expression is as follows:

$$P_{d_0}(LLR = \acute{L}) = \sum_{\acute{L}=f(\acute{L}_i, \acute{L}_j)} P_{c_0}(\acute{L}_i) \times P_{c_4}(\acute{L}_j),$$

$$P_{d_4}(LLR = \acute{L}) = \sum_{\acute{L}=\acute{L}_i+\acute{L}_j} P_{c_0}(\acute{L}_i) \times P_{c_4}(\acute{L}_j),$$

where $f(\acute{L}_i, \acute{L}_i) \triangleq \left(1 - 2^{sign(\acute{L}_i)^*sign(\acute{L}_j)}\right) \times \min(abs(\acute{L}_i), abs(\acute{L}_j))$.

Step 6: Determine the reliability sequence based on the LLR distribution of the third bits.

The accuracy of each third bit is determined with reference to a relational expression $P_u=\Sigma P_u(\acute{L}>0)+0.5 \times P_u(\acute{L}=0)$. The reliability of each third bit is determined based on the accuracy of each third bit. Then, the reliability sequence is determined based on the reliability of each third bit. Herein, the reliability sequence includes the 16 third bits sorted based on the reliability.

In at least one embodiment, the third bit is also referred to as a polarized sub-channel, and the polarized sub-channel is used for mapping a to-be-encoded bit in polar encoding, so that the polarized sub-channel is referred to as a sub-channel for short. In at least one embodiment, a quantity of sub-channels is Nmax (to be specific, Smax×Bmax), Nmax sub-channels form an encoding sequence, and each sub-channel in the encoding sequence corresponds to a sequence number based on a location of the sub-channel. For example, a preset symbol quantity Smax=16. To be specific, the encoding sequence includes 16 symbols, and the 16 symbols is represented as a symbol 0 to a symbol 15. A preset modulation order Bmax=4. To be specific, each symbol corresponds to four bits. The quantity of sub-channels Nmax is 16×4=64, and 64 sub-channels is represented as a sub-channel 0 to a sub-channel 63. For example, for the encoding sequence, refer to FIG. 7a. The sub-channel 0, the sub-channel 16, the sub-channel 32, and the sub-channel 48 corresponds to the symbol 0, and the sub-channel 1, the sub-channel 17, the sub-channel 33, and the sub-channel 49 corresponds to the symbol 1, and the like.

Alternatively, the location of the sub-channel in the encoding sequence is represented by using a sequence number of a symbol in which the sub-channel is located and a sequence number of the sub-channel in the symbol. For example, a sub-channel (0, 0) represents that the sub-channel is the sub-channel 0 in the symbol 0, namely, the first sub-channel in the first symbol. For another example, a sub-channel (0, 1) represents that the sub-channel is the sub-channel 1 in the symbol 0, namely, the second sub-channel in the first symbol. For another example, a sub-channel (1, 0) represents that the sub-channel is the sub-channel 0 in the symbol 1, namely, the first sub-channel in the second symbol. For another example, a sub-channel (1, 1) represents that the sub-channel is the sub-channel 1 in the symbol 1, namely, the second sub-channel in the second symbol.

For ease of description, the following uses the sequence number of the sub-channel to represent the location of the sub-channel in the encoding sequence for example.

The Nmax sub-channels is sorted in a descending order based on reliability of the Nmax sub-channels, to obtain the reliability sequence. The reliability sequence is divided into Bmax sub-sequences based on energy levels, and each sub-sequence corresponds to one energy level. Further, each sub-sequence includes Smax sub-channels.

Figures 7A, 7B:
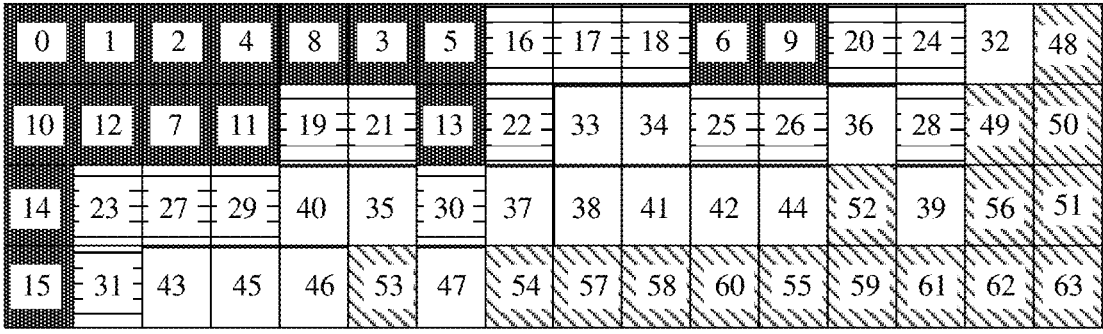
FIG. 7a is a schematic diagram of an example of an encoding sequence according to at least one embodiment.
FIG. 7b is a schematic diagram of an example of a reliability sequence according to at least one embodiment.

FIG. 7b is a schematic diagram of an example of a reliability sequence according to at least one embodiment. The reliability sequence corresponds to the example of the encoding sequence shown in FIG. 7a. In the reliability sequence, reliability of sub-channels from top to bottom gradually increases, and reliability of sub-channels from left to right gradually increases. For example, reliability of a sub-channel 62 is greater than reliability of a sub-channel 56, and reliability of the sub-channel 62 is greater than reliability of a sub-channel 61.

Further, the reliability sequence includes four sub-sequences, and each sub-sequence corresponds to one energy level. For example, the four sub-sequences are represented as a sub-sequence 0, a sub-sequence 1, a sub-sequence 2, and a sub-sequence 3, and respectively correspond to an energy level 0, an energy level 1, an energy level 2, and an energy level 3. The energy levels are sorted in ascending order as follows: the energy level 0, the energy level 1, the energy level 2, and the energy level 3. Each sub-sequence includes 16 sub-channels, where the sub-sequence 0 includes 16 sub-channels corresponding to a pattern 1, the sub-sequence 1 includes 16 sub-channels corresponding to a pattern 2, the sub-sequence 2 includes 16 sub-channels corresponding to a pattern 3, and the sub-sequence 3 includes 16 sub-channels corresponding to a pattern 4.

Herein, in FIG. 7b, the 16 sub-channels included in the sub-sequence 0, namely, sub-channels 0 to 15, correspond to sub-channels in the first row in FIG. 7a. The sub-channels included in the first row in FIG. 7a form the sub-sequence 0. Similarly, in FIG. 7a, sub-channels included in the second row form the sub-sequence 1, sub-channels included in the third row form the sub-sequence 2, and sub-channels included in the fourth row form the sub-sequence 3.

Based on the constructed reliability sequence, during encoding at a transmitting end, the transmitting end determines an information sub-channel and a frozen bit from the encoding sequence based on a symbol quantity and a modulation order in current encoding and reliability of the sub-channels in the reliability sequence, and encode to-be-encoded information based on the information sub-channel and the frozen bit.

To better explain at least one embodiment, a bit sequence and a sub-channel used in an encoding process in at least one embodiment are first explained and described. In at least one embodiment, in response to the transmitting end sending K information bits to a receiving end, the transmitting end obtains a sending length L based on an information bit quantity K and a bit rate R, where the sending length L is a bit quantity actually sent by the transmitting end to the receiving end.

The sending length L corresponds to a mother code length N, the mother code length N is less than or equal to a maximum mother code length Nmax, and the maximum mother code length Nmax is understood as a quantity of sub-channels included in the reliability sequence. In this case, an area between the mother code length N and the maximum mother code length Nmax is an unavailable area, and the unavailable area cannot be used by the transmitting end to determine the information sub-channel. An area corresponding to the mother code length N is an available area, and an area other than the available area in an area corresponding to the maximum mother code length Nmax is the unavailable area.

Further, the mother code length N is greater than or equal to the sending length L, and the transmitting end matches the sending length L with the mother code length N in a rate matching manner. On a to-be-encoded side, in response to selecting the information sub-channel from the available area, the transmitting end selects a shortened sub-channel or a punctured sub-channel at the same time. The shortened sub-channel or the punctured sub-channel corresponds to a pre-frozen sub-channel on the to-be-encoded side, and the shortened sub-channel or the punctured sub-channel is deleted by the transmitting end on an encoded side. Further, on the to-be-encoded side, after excluding the shortened sub-channel or the punctured sub-channel from the available area, the transmitting end obtains a candidate area, and the transmitting end selects the information sub-channel from the candidate area. A sub-channel other than the information sub-channel in the candidate area is set as a frozen sub-channel, and the frozen sub-channel is used to place the frozen bit.

Figure 8:
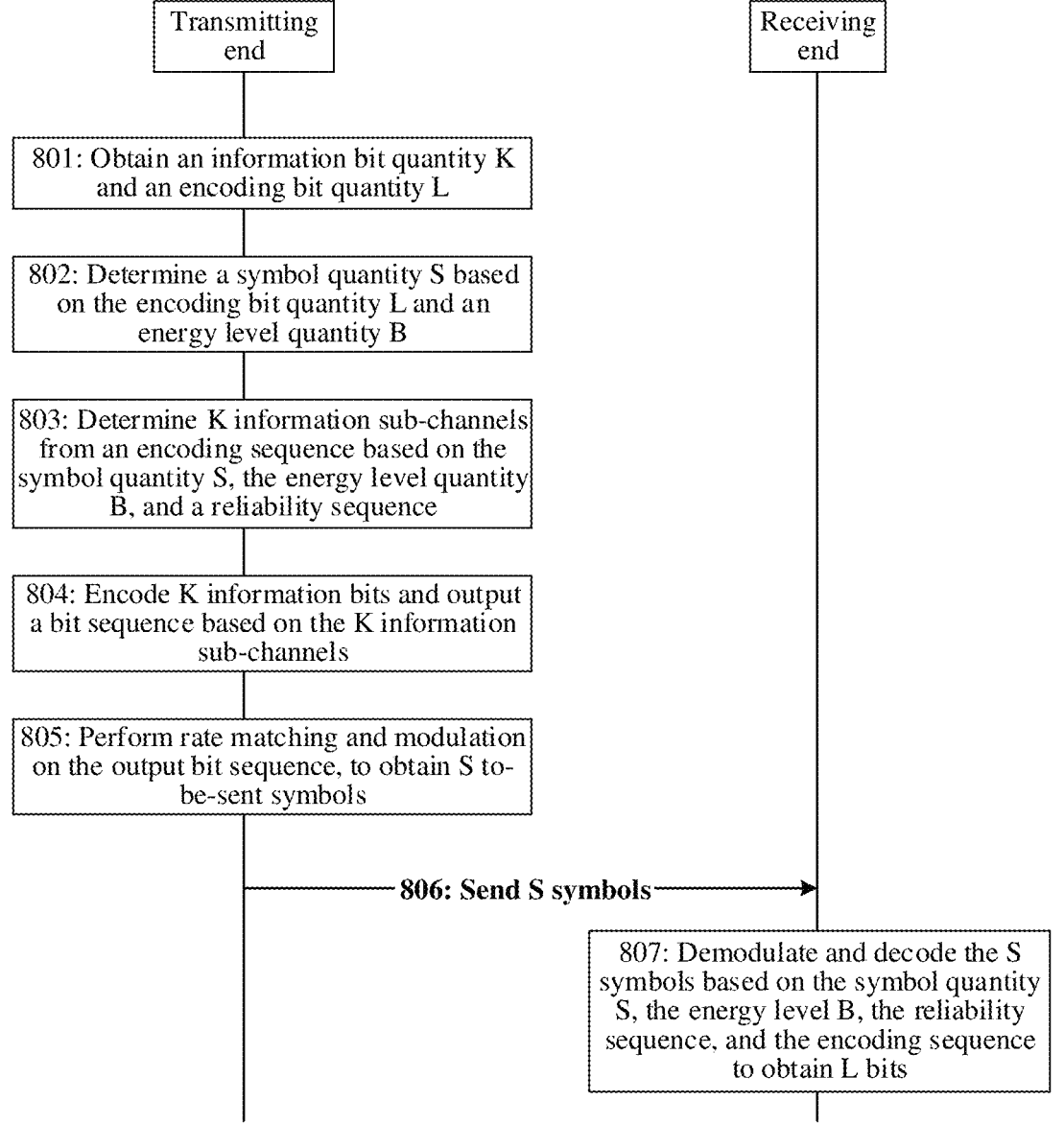
FIG. 8 is a schematic flowchart of an example of encoding and decoding according to at least one embodiment.

FIG. 8 is a schematic flowchart of an example of encoding and decoding according to at least one embodiment.

Step 801: A transmitting end obtains an information bit quantity K and an encoding bit quantity L.

In response to the transmitting end sending an information bit sequence, the transmitting end determines the encoding bit quantity L based on the information bit quantity K and a bit rate R that are included in the information bit sequence. Optionally, the encoding bit quantity L equals to the information bit quantity K divided by the bit rate R, where K and L are both positive integers, and R is less than or equal to 1.

Step 802: The transmitting end determines a symbol quantity S based on the encoding bit quantity L and an energy level quantity B, where the symbol quantity S is S1 or S2, S1=L/B, and S2=L/2B. S1, S2, and B are positive integers.

At least one embodiment is applicable to a plurality of modulation schemes, such as PAM, QAM, ASK, and PSK.

For single-channel modulation (where a symbol includes only a real part), for example, the PAM or the ASK, the transmitting end determines the symbol quantity S1 based on the encoding bit quantity L and the energy level quantity B, where S1=L/B.

For two-channel modulation (where the symbol includes the real part and an imaginary part), for example, the QAM or the PSK, the transmitting end determines the symbol quantity S2 based on the encoding bit quantity L and the energy level quantity B, where S2=L/2B.

Step 803: The transmitting end determines K information sub-channels from an encoding sequence based on the symbol quantity S, the energy level quantity B, and a reliability sequence. The K information sub-channels are sub-channels used to place K information bits.

In an optional implementation, the K information sub-channels are selected from candidate sub-channels based on an order of reliability of the candidate sub-channels. The K information sub-channels is selected from the candidate sub-channels in descending order of reliability of the candidate sub-channels. Further, the candidate sub-channels are S1 sub-channels or 2×S2 sub-channels in a sub-sequence whose energy level is i, where i is an integer from 0 to B−1. In other words, an energy level 0 to an energy level quantity B−1 correspond to B sub-sequences, and the transmitting end determines the S1 sub-channels or the 2×S2 sub-channels from each of the B sub-sequences.

In at least one embodiment, the transmitting end determines a mother code length of the symbol S' based on the symbol quantity S, and determine a mother code length in the symbol B' based on the energy level quantity B (namely, a bit quantity B in the symbol). The mother code length of the symbol S' and the mother code length in the symbol B' is used for determining a mother code length N. Optionally, the mother code length N is a product of the mother code length of the symbol S' and the mother code length in the symbol B'.

For example, the mother code length of the symbol S' is obtained based on a formula $S'=2^{\lceil log_2(S) \rceil}$. For example, in response to the symbol quantity S equaling to 14, the mother code length of the symbol $S'=2^{\lceil log_2(14) \rceil}=16$; and for another example, in response to the symbol quantity S equaling to 7, the mother code length of the symbol $S'=2^{\lceil log_2(7) \rceil}=8$.

The mother code length in the symbol B' is obtained based on a formula $B'=2^{\lceil log_2(B) \rceil}$. For example, in response to the bit quantity in the symbol B equaling to 3, the mother code length in the symbol $B'=2^{\lceil log_2(3) \rceil}=4$; and for example, in response to the bit quantity in the symbol B equaling to 2, the mother code length in the symbol $B'=2^{\lceil log_2(2) \rceil}=2$.

In response to the mother code length of the symbol S' being less than a preset symbol quantity Smax, and/or the mother code length in the symbol B' is less than a preset energy level quantity Bmax, the transmitting end sets a pre-frozen sub-channel, and the pre-frozen sub-channel is processed as a frozen bit in an encoding and decoding process. The pre-frozen sub-channel is also referred to as an unavailable sub-channel. The pre-frozen sub-channel corresponds to an unavailable area in the encoding sequence, and an area other than the unavailable area in the encoding sequence is an available area.

For an implementation in which the transmitting end determines the pre-frozen sub-channel, refer to the following example 1 to example 3.

Example 1: In response to the mother code length of the symbol S' being less than the preset symbol quantity Smax, the transmitting end determines the unavailable sub-channel based on the mother code length of the symbol S' and the preset symbol quantity Smax. Refer to the example of the encoding sequence shown in FIG. 7a. For example, the preset symbol quantity Smax equals to 16, and assuming that the mother code length of the symbol S'=8, the transmitting end determines that all sub-channels corresponding to a symbol 8 to a symbol 15 are unavailable sub-channels.

Example 2: In response to the mother code length in the symbol B' being less than the preset energy level quantity Bmax, the transmitting end determines the unavailable sub-channel based on the mother code length in the symbol B' and the preset energy level quantity Bmax. Refer to the example of the encoding sequence shown in FIG. 7a. For example, the preset energy level quantity Bmax equals to 4, and assuming that the mother code length in the symbol B'=2, the transmitting end determines that a third sub-channel and fourth sub-channel in each symbol are unavailable sub-channels.

Example 3: In response to the mother code length of the symbol S' being less than the preset symbol quantity Smax, and the mother code length in the symbol B' is less than the preset energy level quantity Bmax, the transmitting end determines the unavailable sub-channel based on the mother code length of the symbol S' and the preset symbol quantity Smax, and based on the mother code length in the symbol B' and the preset energy level quantity Bmax. Refer to the example of the encoding sequence shown in FIG. 7a. For example, the preset symbol quantity Smax equals to 16, the preset energy level quantity Bmax equals to 4, and assuming that the mother code length of the symbol S'=8, and the mother code length in the symbol B'=2, the transmitting end determines the sub-channels corresponding to the symbol 8 to the symbol 15, and both a third sub-channel and a fourth sub-channel of each symbol in a symbol 0 to a symbol 7 are unavailable sub-channels.

In response to the mother code length of the symbol S' being equal to the preset symbol quantity Smax, and the mother code length in the symbol B' is equal to the preset energy level quantity Bmax, the transmitting end is able to not perform the step of determining the available area (or in other words, the transmitting end is able to not perform the step of determining the unavailable area).

In an optional implementation, in response to the symbol quantity S being less than the mother code length of the symbol S', and/or the energy level quantity B is less than the mother code length in the symbol B', the transmitting end determines the pre-frozen sub-channel from the available area based on the symbol quantity S and the energy level quantity B. The pre-frozen sub-channel is a sub-channel corresponding to a punctured sub-channel or a shortened sub-channel on a to-be-encoded side. After excluding the pre-frozen sub-channel from a candidate area, the transmitting end obtains the candidate area, where the candidate area includes a plurality of candidate sub-channels, and the transmitting end obtains the information sub-channel from the plurality of candidate sub-channels. A specific rate matching manner is not within the protection scope of embodiments described herein. Therefore, for ease of description, in at least one embodiment, a manner of determining a shortened sub-channel in response to rate matching shortening being used as an example for description. A manner of determining a punctured sub-channel in response to the rate matching being puncturing is similar to that of determining the shortened sub-channel, and details are not described again.

For an implementation in which the transmitting end determines the pre-frozen sub-channel corresponding to the shortened sub-channel, refer to the following example a to example c.

Example a: In response to the bit quantity in the symbol B being less than the mother code length in the symbol B', the transmitting end determines, from the available area based on the bit quantity in the symbol B and the mother code length in the symbol B', the pre-frozen sub-channel corresponding to the shortened sub-channel, where the pre-frozen sub-channel is used for intra-symbol rate matching. For example, in QAM64, a one-channel signal (for example, an I-channel signal or a Q-channel signal) includes three bits. In other words, the bit quantity in the symbol B equals to 3, and the mother code length in the symbol B'=4. A pre-frozen sub-channel corresponding to the shortened sub-channel in the symbol is a fourth sub-channel. For another example, in QAM1024, a one-channel signal (for example, an I-channel signal or a Q-channel signal) includes five bits, the bit quantity in the symbol B equals to 5, and the mother code length in the symbol B'=8. Pre-frozen sub-channels corresponding to the shortened sub-channel in the symbol are a fourth sub-channel, a sixth sub-channel, and an eighth sub-channel.

Example b: In response to the symbol quantity S being less than the mother code length of the symbol S', the transmitting end determines, from the available area based on the symbol quantity S and the mother code length of the symbol S', the pre-frozen sub-channel corresponding to the shortened sub-channel, where the pre-frozen sub-channel is used for inter-symbol rate matching. For example, in response to the symbol quantity being 14 and the mother code length of the symbol S' is 16, in a symbol 0 to a symbol 15, sub-channels corresponding to the symbol 14 and the symbol 15 are pre-frozen sub-channels corresponding to the shortened sub-channel.

Example c: In response to the bit quantity in the symbol B being less than the mother code length in the symbol B', and the symbol quantity S is less than the mother code of the symbol S', the transmitting end determines, from the available area, a pre-frozen sub-channel corresponding to the shortened sub-channel based on the bit quantity in the symbol B and the mother code length in the symbol B', and based on the symbol quantity S and the mother code of the symbol S'. For example, in the QAM64, in response to the bit quantity in the symbol B being equal to 3, the mother code length in the symbol B'=4, the symbol quantity is 14, and the mother code length of the symbol S' is 16, the sub-channels corresponding to the symbol 14 and the symbol 15 in the symbol 0 to the symbol 15 and a fourth sub-channel in each symbol of the symbol 0 to the symbol 13 is a pre-frozen sub-channel corresponding to the shortened sub-channel. In this example, the pre-frozen sub-channel used for inter-symbol rate matching is represented as Ps=[14, 15], and a pre-frozen sub-channel used for intra-symbol rate matching is represented as Pb=[3].

In response to the symbol quantity S being equal to the mother code length of the symbol S', and in response to the bit quantity in the symbol B being equal to the mother code length in the symbol B', the transmitting end is able to not determine the pre-frozen sub-channel corresponding to the shortened sub-channel.

After determining shortened sub-channels and pre-frozen sub-channels corresponding to the shortened sub-channels, the transmitting end excludes the sub-channels from the available area, to obtain the candidate area. Then, in the plurality of candidate sub-channels in the candidate area, whether each candidate sub-channel is the pre-frozen sub-channel is sequentially determined based on descending order of reliability, and in response to the candidate sub-channel being the pre-frozen sub-channel, skip the candidate sub-channel, or in response to the candidate sub-channel not being the pre-frozen sub-channel, determine the candidate sub-channel as the information sub-channel.

In at least one embodiment, in response to determining that a sequence number of a sub-channel meets a formula $$\frac{x}{s'} \in Pb$$

or meets a formula mod(x, s')∈ Ps, the transmitting end determines that the sub-channel is the pre-frozen sub-channel.

With reference to the reliability sequence shown as an example in FIG. 7*b*, an information bit quantity K that is to be sent by the transmitting end equals to 21, a code rate R equals to 0.5, a modulation order B equals to 3, and a symbol quantity S equals to 14. In this case, the transmitting end determines 21 information sub-channels from the encoding sequence based on the reliability sequence. In this example, in response to the symbol quantity S being equal to 14, sub-channels corresponding to the symbol 14 and the symbol 15 are pre-frozen sub-channels, and in response to the modulation order B being equal to 3, sub-channels corresponding to the pattern 4 in FIG. 7*b* (in other words, a fourth sub-channel in each symbol in the symbol 0 to the symbol 13) are pre-freeze sub-channels. For example, the transmitting end determines, in descending order of reliability, that a first sub-channel (namely, a sub-channel 63) to a ninth sub-channel (namely, a sub-channel 54) are the pre-frozen sub-channels, a tenth sub-channel (namely, a sub-channel 47) is the information sub-channel, an eleventh sub-channel (namely, a sub-channel 53) is the pre-frozen sub-channel, and so on, until the 21 information sub-channels are determined. Then, remaining sub-channels are used as frozen sub-channels. For locations of the constructed information sub-channels and frozen sub-channels, refer to FIG. 9. A pattern 1 represents a pre-frozen sub-channel corresponding to a shortened sub-channel. A pattern 2 represents an information sub-channel, and is used for carrying 21 bits in a to-be-encoded bit sequence. A pattern 3 represents a frozen sub-channel. For example, a value of each frozen sub-channel is set to 0.

In at least one embodiment, the transmitting end obtains L candidate sub-channels after excluding the determined pre-frozen sub-channels from the encoding sequence. The transmitting end determines the L candidate sub-channels from the encoding sequence based on the symbol quantity S and the energy level quantity B. In response to a modulation scheme being single-channel modulation, the L candidate sub-channels are S1×B sub-channels. In response to the modulation scheme being two-channel modulation, the L candidate sub-channels are 2×S2×B sub-channels. Then, the transmitting end determines K information sub-channels from the L candidate sub-channels based on reliability of each candidate sub-channel in descending order of reliability, where the K information sub-channels is used for carrying K information bits. Remaining L-K sub-channels in the L candidate sub-channels is used for carrying L-K frozen bits. Further, the L-K sub-channels and the determined pre-frozen sub-channels is used as frozen sub-channels.

With reference to the reliability sequence shown as an example in FIG. 7b, the information bit quantity K that is to be sent by the transmitting end equals to 21, the code rate R equals to 0.5, the modulation order B equals to 3, and the symbol quantity S equals to 14. The encoding bit quantity L equals to the information bit quantity K divided by the code rate R and equals to 42. The transmitting end determines the sub-sequence 0, the sub-sequence 1, and the sub-sequence 2 from the encoding sequence, and separately determine 14 sub-channels from each of the sub-sequence 0, the sub-sequence 1, and the sub-sequence 2. For example, the transmitting end determines a sub-channel 0 to a sub-channel 13 in each sub-sequence of the sub-sequence 0, the sub-sequence 1, and the sub-sequence 2 as candidate sub-channels, to obtain 42 candidate sub-channels. Then, in descending order of reliability of the candidate sub-channels, 21 information sub-channels are determined from the 42 candidate sub-channels, where the 21 information sub-channels are used for carrying 21 information bits, and the remaining 21 candidate sub-channels is used for carrying 21 frozen bits.

Step 804: The transmitting end encodes the K information bits and outputs a bit sequence based on the K information sub-channels.

The transmitting end respectively places the K information bits in the K information sub-channels, and set both the L-K frozen sub-channels and the pre-frozen sub-channels to 0, to obtain a to-be-encoded bit sequence whose length is N (the mother code length of the symbol S'×the mother code length in the symbol B'). For an encoding process, refer to the process from left to right in FIG. 3, or refer to the process from bottom to top in FIG. 4. The encoding is an encoding scheme in which an existing polar code is used, and details are not described again.

Step 805: The transmitting end performs rate matching and modulation on the output bit sequence, to obtain S to-be-sent symbols.

After outputting an encoded bit sequence, the transmitting end performs rate matching on the output encoded bit sequence, where the rate matching is a bit corresponding to an unsent shortened sub-channel. The embodiment corresponding to FIG. 9 is used for description. All sub-channels corresponding to the pattern 1 are shortened sub-channels. In response to performing rate matching, the transmitting end does not send bits corresponding to the sub-channels. A bit sequence obtained through rate matching performed by the transmitting end is referred to as a to-be-modulated bit sequence, and the transmitting end performs modulation on the to-be-modulated bit sequence to obtain a to-be-sent symbol (which is referred to as a symbol to be sent). In addition, at least one embodiment does not exclude a case in which the transmitting end does not perform rate matching on the encoded bit sequence. In this case, the transmitting end modulates the encoded bit sequence as the to-be-modulated bit sequence into the to-be-sent symbol.

In at least one embodiment, the to-be-modulated bit sequence corresponds to B sub-sequences, and S sub-channels included in each sub-sequence respectively correspond to S bits. In the to-be-modulated bit sequence, in ascending order of energy levels, one bit is sequentially selected from the bits corresponding to each sub-sequence and mapped to one to-be-sent symbol, that is, S to-be-sent symbols are obtained by mapping. In at least one embodiment, the transmitting end maps the to-be-modulated bit sequence into the S to-be-sent symbols. For example, a $(j_1 \times B + j_2)^{th}$ bit in the to-be-modulated bit sequence is mapped to a $j_2^{th}$ bit in a $j_1^{th}$ to-be-sent symbol, where $j_1$ is a positive integer less than S, and $j_2$ is a positive integer less than B.

Refer to FIG. 9. For example, S equals to 14, and B equals to 3, the to-be-modulated bit sequence includes 14×3=42 bits, and the transmitting end maps the 42 bits to 14 to-be-sent symbols. In the ascending order of energy levels, a bit 0, a bit 16, and a bit 32 that respectively correspond to a sub-channel 0, a sub-channel 16, and a sub-channel 32 is mapped to a symbol 0, a bit 1, a bit 17, and a bit 33 that respectively correspond to a sub-channel 1, a sub-channel 17, and a sub-channel 33 are mapped to a symbol 1, and by analogy, the 42 to-be-modulated bits are mapped to the 14 to-be-sent symbols.

Optionally, after the S to-be-sent symbols are obtained through modulation, symbol-level interleaving processing is performed on the S to-be-sent symbols. For example, the transmitting end modulates the bit sequence into the 14 to-be-sent symbols (represented as the symbol 0 to a symbol 13), and a sequence in which the transmitting end sends the symbols to a receiving end is: the symbol 0, a symbol 7, the symbol 1, a symbol 8, a symbol 2, a symbol 9, a symbol 3, a symbol 10, a symbol 4, a symbol 11, a symbol 5, a symbol 12, a symbol 6, and the symbol 13. Therefore, this helps improve anti-interference performance of the to-be-sent symbols in response to burst continuous noise in a sending process.

In at least one embodiment, not only the S to-be-sent symbols is interleaved after the modulation, but also the bit sequence is interleaved before the modulation. To ensure that a correlated bit is still mapped to a same to-be-sent symbol, in response to interleaving processing being performed on the bit sequence, a same interleaved sequence is used for the bit corresponding to the sub-channel in each sub-sequence. For example, in FIG. 9, a sub-sequence 0 includes the sub-channel 0 to a sub-channel 13, and the sub-channel 0 to the sub-channel 13 respectively correspond to the bit 0 to a bit 13; a sub-sequence 1 includes the sub-channel 16 to a sub-channel 29, and the sub-channel 16 to the sub-channel 29 respectively correspond to the bit 16 to a bit 29; and a sub-sequence 2 includes the sub-channel 32 to a sub-channel 45, and the sub-channel 32 to the sub-channel 45 respectively correspond to the bit 32 to a bit 45. For example, in interleaving of the 14 bits corresponding to the sub-sequence 0, a sequence of the bits after the interleaving is: the bit 0, the bit 7, the bit 1, the bit 8, the bit 2, the bit 9, the bit 3, the bit 10, the bit 4, the bit 11, the bit 5, the bit 12, the bit 6, and the bit 13. Correspondingly, the sub-sequence 1 and the sub-sequence 2 perform the same interleaving. For example, in the interleaving of the 14 bits corresponding to the sub-sequence 1, a sequence of the bits after the interleaving is: the bit 16, the bit 23, the bit 17, the bit 24, the bit 18, the bit 25, the bit 19, the bit 26, the bit 20, the bit 27, the bit 21, the bit 28, the bit 22, and the bit 29.

In at least one embodiment, different sub-sequences correspond to different energy levels. In response to a plurality of bits being mapped to a same symbol, energy levels of the plurality of bits in the same symbol are sorted in an order.

In an example in which ASK is used for explanation, in response to an energy level quantity being 2, two bits is mapped to a constellation of ASK4, and corresponding energy levels are respectively an energy level 0 and an energy level 1; in response to the energy level quantity being 3, three bits is mapped to a constellation of ASK8, and corresponding energy levels are respectively the energy level 0, the energy level 1, and an energy level 2; and in response to the energy level quantity being 4, four bits is mapped to a constellation of ASK16, and corresponding energy levels are respectively the energy level 0, the energy level 1, the energy level 2, and an energy level 3.

Further, in an example in which QAM is used for explanation, in response to the energy level quantity being 2, two bits is mapped to a constellation of QAM16, and corresponding energy levels are respectively the energy level 0 and the energy level 1; in response to the energy level quantity being 3, three bits is mapped to a constellation of QAM64, and corresponding energy levels are respectively the energy level 0, the energy level 1, and the energy level 2; and in response to the energy level being 4, four bits is mapped to a constellation of QAM256, and corresponding energy levels are respectively the energy level 0, the energy level 1, the energy level 2, and the energy level 3.

Energy corresponding to the energy level 0, the energy level 1, the energy level 2, and the energy level 3 are in the ascending order.

In addition, in response to the energy level being 4, for example, in the ASK16 or the QAM256, mapping orders of the bit in the sub-sequence corresponding to the energy level 2 and the bit in the sub-sequence corresponding to the energy level 3 is exchanged. For example, the four bits are mapped to the constellation of the ASK16, and the corresponding energy levels are respectively the energy level 0, the energy level 1, the energy level 3, and the energy level 2. For another example, the four bits are mapped to the constellation of the QAM256, and the corresponding energy levels are respectively the energy level 0, the energy level 1, the energy level 3, and the energy level 2. In this manner, transmission performance of the symbol in a channel is improved.

Step 806: The transmitting end sends S symbols to the receiving end. The receiving end receives the S symbols from the transmitting end.

Step 807: The receiving end demodulates and decodes the S symbols based on the symbol quantity S, the energy level quantity B, the reliability sequence, and the encoding sequence to obtain L bits, where the L bits include the K information bits.

In at least one embodiment, the receiving end and the transmitting end pre-agree on the energy level, the reliability sequence, the encoding sequence, and the like. Therefore, after receiving the S symbols from the transmitting end, the receiving end performs demodulation and decoding based on the pre-agreed energy level, the reliability sequence, the encoding sequence, and the like. The receiving end performs demodulation processing on the S symbols based on the symbol quantity S and the energy level quantity B, to obtain L demodulated LLRs, where the L LLRs correspond to L to-be-decoded bits. For example, in response to the LLR being greater than 0, a value of the to-be-decoded bit corresponding to the LLR is 1; and in response to the LLR being less than 0, a value of the to-be-decoded bit corresponding to the LLR is 0. Then, the receiving end determines the K information sub-channels based on the symbol quantity S, the reliability sequence, and the encoding sequence, and the K information sub-channels correspond to the K information bits in the L to-be-decoded bits. Therefore, the receiving end obtains information actually sent by the transmitting end to the receiving end. In at least one embodiment, for a manner of determining the K information sub-channels by the receiving end, refer to the manner of determining the K information sub-channels by the transmitting end in step 803. Details are not described again.

In a demodulation process at the receiving end, the receiving end sequentially maps B bits included in each of the S symbols to the B sub-sequences whose energy levels are sorted in the ascending order. For example, in FIG. 9, S equals to 14, B equals to 3, the bit 0, the bit 16, and the bit 32 included in the symbol 0 are respectively mapped to first sub-channels of the sub-sequence 0, the subsequence 1, and the subsequence 2, and the bit 1, the bit 17, and the bit 33 included in the symbol 1 are respectively mapped to second sub-channels of the sub-sequence 0, the sub-sequence 1, and the sub-sequence 2, and so on, to obtain the sub-sequence 0, the sub-sequence 1, and the sub-sequence 2. The 14 sub-channels included in each sub-sequence respectively correspond to the 14 bits. For example, the 14 sub-channels included in the sub-sequence 0 respectively correspond to the bit 0 to the bit 13.

In response to the energy level quantity being 4, for example, in the ASK16 or the QAM256, the transmitting end exchanges a sequence between the sub-sequence corresponding to the energy level 2 and the sub-sequence corresponding to the energy level 3 during mapping. Correspondingly, during demodulation, the receiving end also is to exchange mapping orders of two bits in the symbol, map a third bit in the symbol to the sub-sequence corresponding to the energy level 3, and map a fourth bit in the symbol to the sub-sequence corresponding to the energy level 2, so that the receiving end demodulates a correct bit sequence.

In response to the transmitting end interleaving the S symbols, after receiving the S symbols, the receiving end first performs de-interleaving on the S symbols, and then perform demodulation and decoding on the S symbols. In response to the transmitting end interleaving the bits in the symbol, after performing demodulation on the S symbols, the receiving end performs de-interleaving on the bits in the symbol, and then perform decoding.

Figure 10:
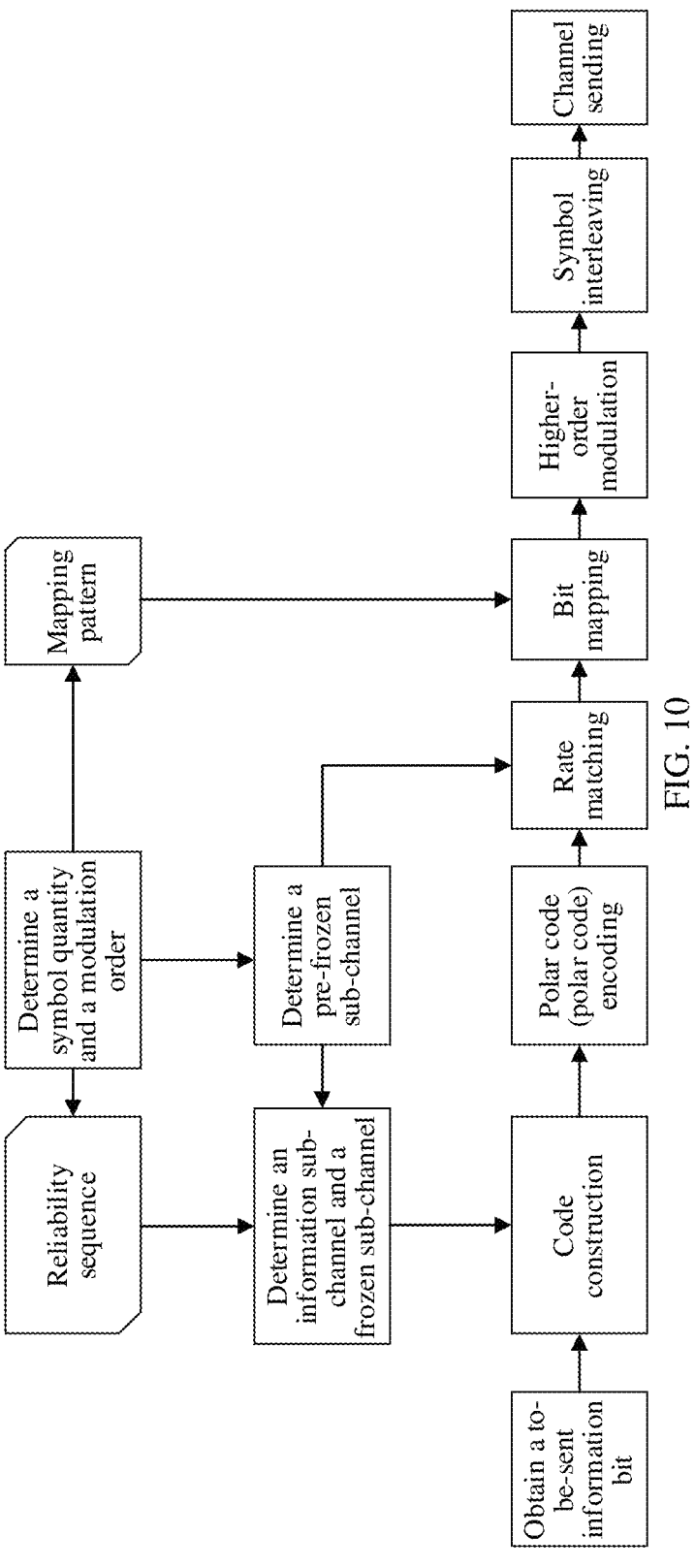
FIG. 10 is a schematic flowchart of an example of sending a symbol by a transmitting end according to at least one embodiment.

FIG. 10 is a schematic flowchart of an example of sending a symbol by a transmitting end according to at least one embodiment. The transmitting end determines a symbol quantity and a modulation order; the transmitting end determines a pre-frozen sub-channel from an encoding sequence based on the symbol quantity and the modulation order; and then, the transmitting end excludes the pre-frozen sub-channel from the encoding sequence, and determines an information sub-channel and a frozen sub-channel from remaining sub-channels based on a reliability sequence. The transmitting end performs code construction based on the determined information sub-channel, the frozen sub-channel, and a to-be-sent information bit, to obtain a to-be-encoded bit sequence. The transmitting end performs polar code encoding on the to-be-encoded bit sequence, to obtain an encoded bit sequence. The transmitting end then performs rate matching on the encoded bit sequence based on the pre-frozen sub-channel. The transmitting end determines a mapping relationship between bits and symbols in the bit sequence obtained through rate matching based on a mapping pattern. The transmitting end modulates the bit sequence into a plurality of to-be-sent symbols in higher order based on the mapping relationship between the bits and the symbols. The transmitting end performs symbol interleaving on the plurality of to-be-sent symbols, and then sends a plurality of interleaved symbols to a receiving end through a channel.

In at least one embodiment, the transmitting end determines the information sub-channel and the frozen sub-channel from the encoding sequence based on an information bit quantity of to-be-sent information, an encoding bit quantity of corresponding to the information bit quantity, and the reliability sequence, and encode the information bit based on the information sub-channel and the frozen sub-channel. In this manner, the reliability sequence is constructed based on correlation between bits in a same symbol, and in a construction process, different energy levels of different bits in the same symbol are further considered. The information bit is encoded based on the information sub-channel determined by the reliability sequence, and the bit sequence that matches higher-order modulation is obtained. Correspondingly, after receiving the symbol, the receiving end also determines the information sub-channel based on the reliability sequence, and decode an accurate information bit. Designs of an encoder and a decoder is not changed. This helps reduce costs.

Further, the reliability sequence is a double nested structure, to be specific, a sequence including sub-channels that jointly correspond to a preset symbol quantity and a preset energy level quantity. The reliability sequence is applicable to different symbol quantities or different energy levels. The transmitting end determines candidate sub-channels based on a symbol quantity and an energy level corresponding to the to-be-sent information bit and the reliability sequence. Then, the information sub-channel and the frozen sub-channel are determined from the candidate sub-channels. For example, modulation corresponding to different energy levels, for example, ASK4, ASK8, and ASK16, all correspond to a same reliability sequence, and different reliability sequences for the modulation corresponding to each energy level are not set. This helps reduce costs.

At least one embodiment provides a new information sub-channel construction method. The method is referred to as a polar code construction method based on bit correlation, is represented as correlation aware polar in English, and is represented as CAP for short in English.

In at least one embodiment, for different modulation orders and different bit sequence lengths, performance comparison between the CAP and an existing construction manner shows that a gain of 1 dB to 1.5 dB is obtained without changing an encoder and a decoder in response to the CAP being used.

The following provides examples of comparison charts between a plurality of performance evaluations.

Figure 11A:
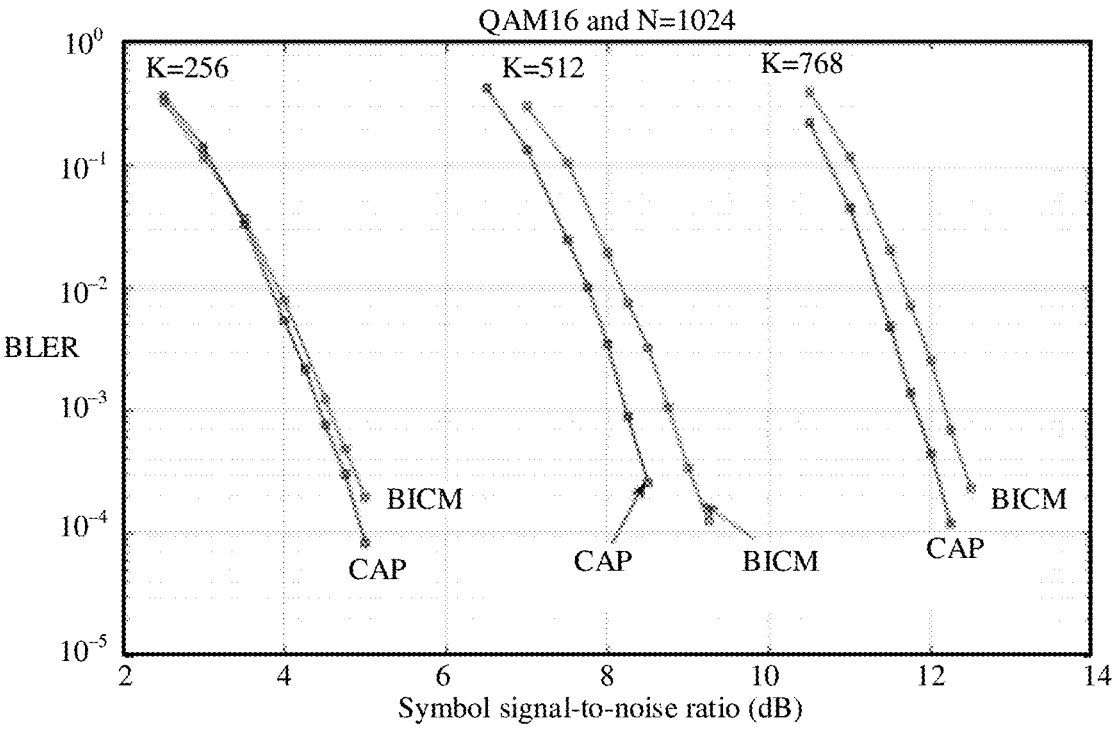
FIG. 11a and FIG. 11b are schematic diagrams of examples of comparison between a group of CAP and BICM according to at least one embodiment.
Figure 11B:
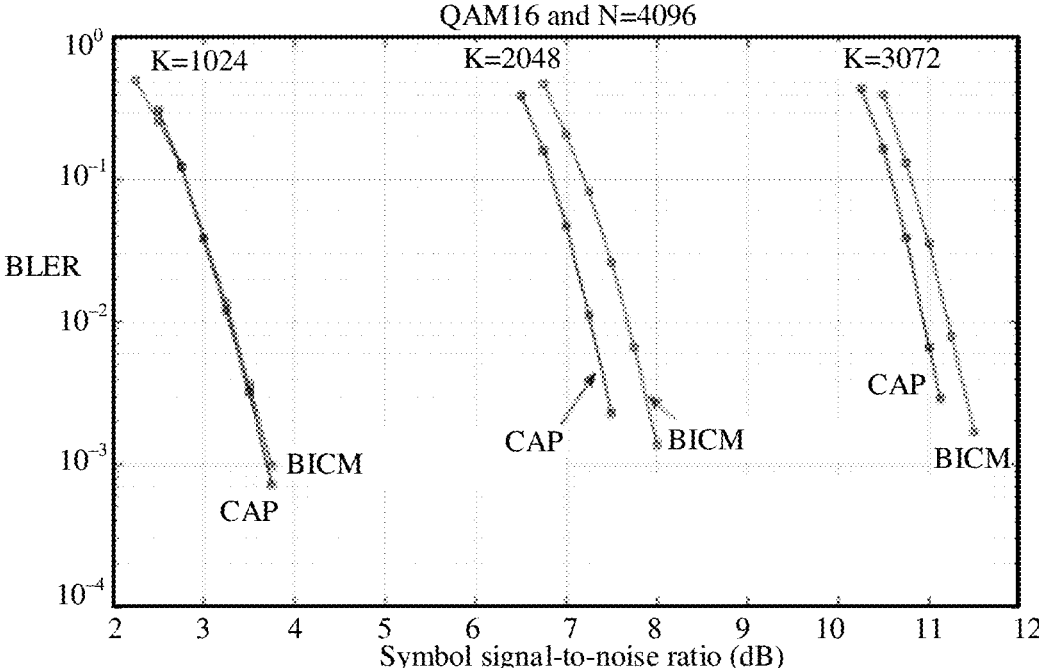

Performance evaluation 1: In a case of QAM16 and N=1024, for comparison between the CAP and BICM, refer to FIG. 11a; and in a case of QAM16 and N=4096, for comparison between the CAP and the BICM, refer to FIG. 11b.

Figure 12A:
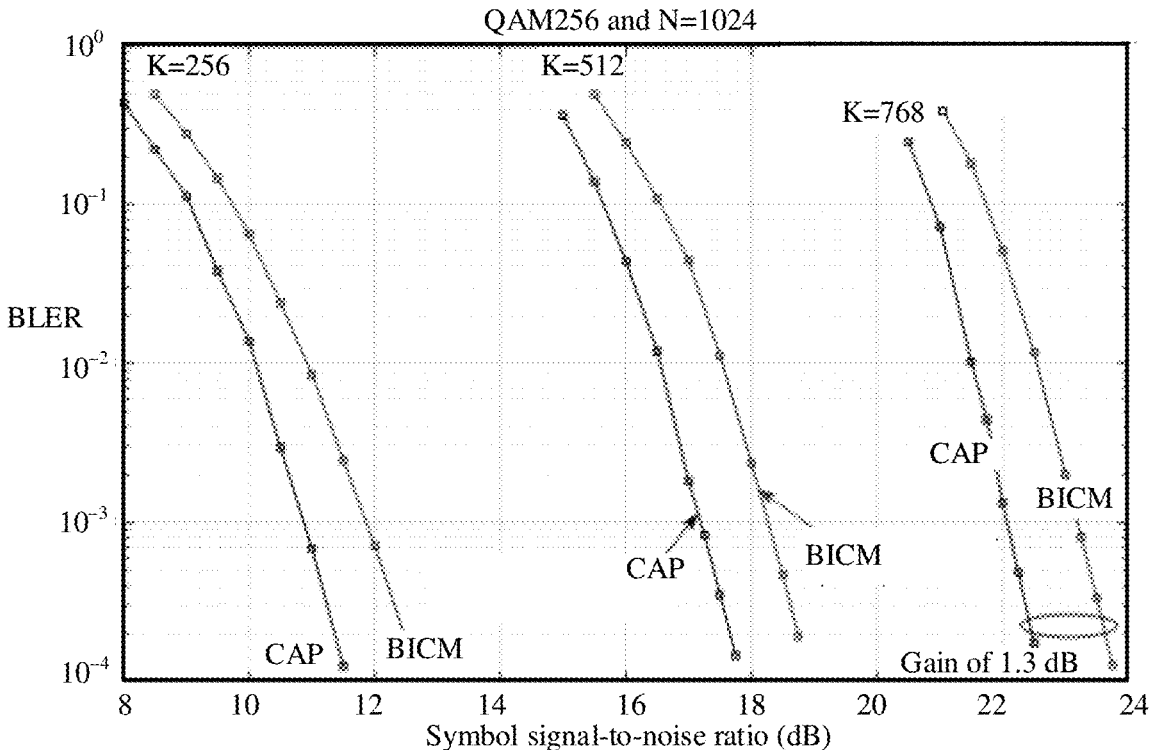
FIG. 12a and FIG. 12b are schematic diagrams of examples of comparison between another group of CAP and BICM according to at least one embodiment.
Figure 12B:
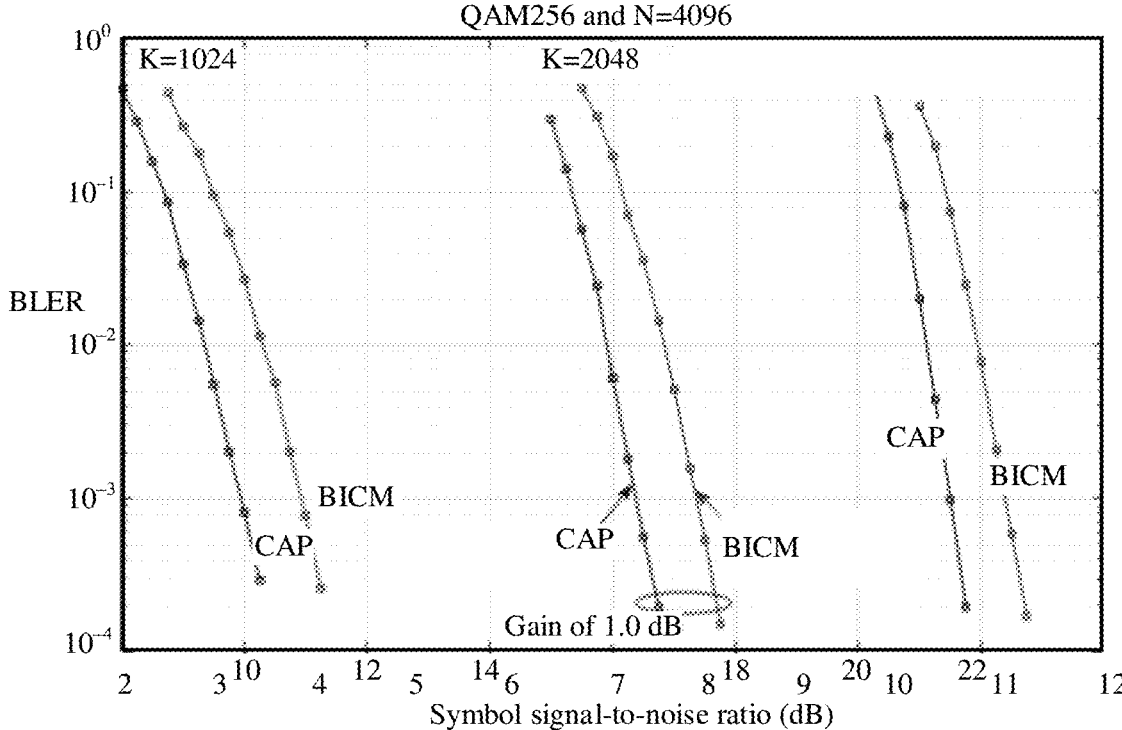

Performance evaluation 2: In a case of QAM256 and N=1024, for comparison between the CAP and the BICM, refer to FIG. 12a; and in a case of QAM256 and N=4096, for comparison between the CAP and the BICM, refer to FIG. 12b.

Figure 13:
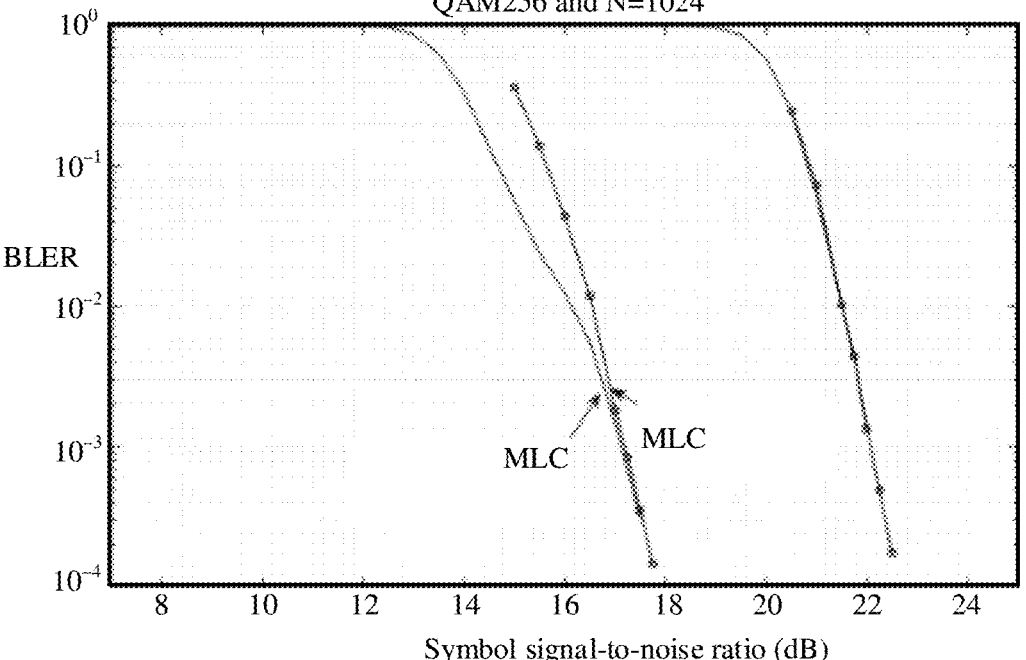
FIG. 13 is a schematic diagram of an example of comparison between CAP and MLC according to at least one embodiment.

Performance evaluation 3: In a case of QAM256 and N=1024, for comparison between the CAP and multilevel coded modulation (MLC), refer to FIG. 13.

Figure 14:
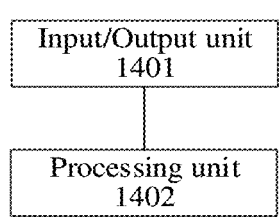
FIG. 14 is a schematic diagram of a structure of a first communication apparatus according to at least one embodiment.
Figure 15:
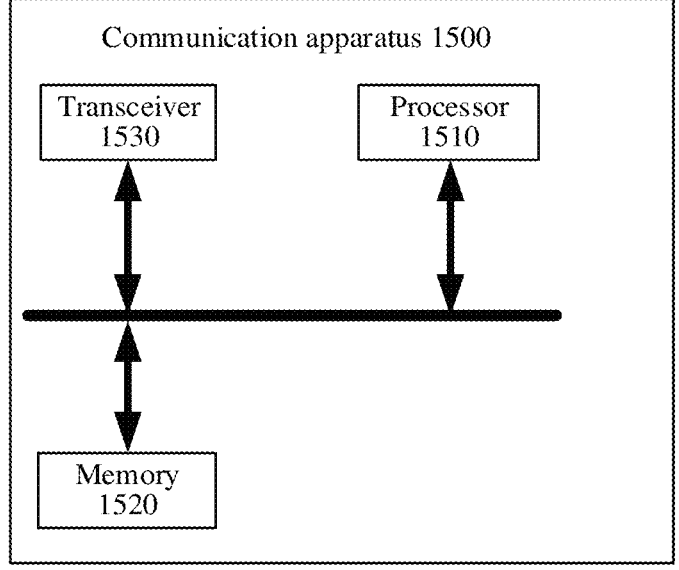
FIG. 15 is a schematic diagram of a structure of a second communication apparatus according to at least one embodiment.

Based on the foregoing content and a same concept, FIG. 14 and FIG. 15 are schematic diagrams of structures of communication apparatuses according to at least one embodiment. The communication apparatuses is configured to implement functions of the transmitting end or the receiving end in the foregoing method embodiments, and therefore also implements beneficial effects of the foregoing method embodiments. In at least one embodiment, the communication apparatus is the transmitting end 101 shown in FIG. 1, or is the receiving end 102 shown in FIG. 1.

In response to the communication apparatus being the transmitting end, the communication apparatus includes an input/output unit 1401 and a processing unit 1402.

In at least one embodiment, the input/output unit 1401 is configured to obtain an information bit quantity K and an encoding bit quantity L; and the processing unit 1402 is configured to determine a symbol quantity S based on the encoding bit quantity L and an energy level quantity B, where S is S1 or S2, S1=L/B, and S2=L/2B, where the processing unit 1402 is further configured to: determine K information sub-channels from an encoding sequence based on the symbol quantity S, the energy level quantity B, and a reliability sequence; and the processing unit 1402 is further configured to encode K information bits and output a bit sequence based on the K information sub-channels, where the encoding sequence includes Bmax sub-sequences, the Bmax sub-sequences respectively correspond to Bmax energy levels, each sub-sequence in the Bmax sub-sequences includes Smax sub-channels, and the reliability sequence indicates an order of reliability of sub-channels in the encoding sequence; the K information sub-channels are selected from candidate sub-channels based on an order of reliability of the candidate sub-channels, and the candidate sub-channels are S1 sub-channels or 2×S2 sub-channels in a sub-sequence whose energy level is i; and K, L, B, S, S1, S2, Bmax, and Smax are all positive integers, Smax is greater than or equal to S, Bmax is greater than or equal to B, and i is greater than or equal to 0 and less than B.

In at least one embodiment, the K information sub-channels are selected in a descending order of reliability from sub-channels that are other than a punctured sub-channel, a shortened sub-channel, and a pre-frozen sub-channel and that are in the candidate sub-channels.

In at least one embodiment, the punctured sub-channel or the shortened sub-channel is determined based on the energy level quantity B and a mother code length in a symbol corresponding to the energy level quantity B.

In at least one embodiment, after encoding the K information bits and outputting a bit sequence based on the K information sub-channels, the processing unit 1402 is further configured to: perform rate matching and modulation on the output bit sequence to obtain S to-be-sent symbols; and perform interleaving processing on the S to-be-sent symbols.

In at least one embodiment, the processing unit 1402 is configured to sequentially select one bit from each sub-sequence of B sub-sequences in an ascending order of energy levels and map the bit to one to-be-sent symbol.

In at least one embodiment, for QAM256, the processing unit 1402 is further configured to exchange mapping orders of a bit selected from a sub-sequence corresponding to a third energy level and a bit selected from a sub-sequence corresponding to a fourth energy level in the ascending order of energy levels.

In at least one embodiment, the encoding is polar code encoding.

In response to the communication apparatus being the receiving end, the communication apparatus includes an input/output unit 1401 and a processing unit 1402.

In at least one embodiment, the input/output unit 1401 is configured to receive S symbols, where a symbol quantity S is S1 or S2; and the processing unit 1402 is configured to: demodulate and decode the S symbols based on the symbol quantity S, an energy level quantity B, a reliability sequence, and an encoding sequence to obtain L bits, where the L bits include K information bits, and L=S1×B, or L=2×S2×B, where the encoding sequence includes Bmax sub-sequences, the Bmax sub-sequences respectively correspond to Bmax energy levels, each sub-sequence in the Bmax sub-sequences includes Smax sub-channels, and the reliability sequence indicates an order of reliability of sub-channels in the encoding sequence; the K information sub-channels are selected from candidate sub-channels based on an order of reliability of the candidate sub-channels, and the candidate sub-channels are S1 sub-channels or 2×S2 sub-channels in a sub-sequence whose energy level is i; and K, L, B, S, S1, S2, Bmax, and Smax are all positive integers, Smax is greater than or equal to S, Bmax is greater than or equal to B, and i is greater than or equal to 0 and less than B.

In at least one embodiment, the K information sub-channels are selected in a descending order of reliability from sub-channels that are other than a punctured sub-channel, a shortened sub-channel, and a pre-frozen sub-channel and that are in the candidate sub-channels.

In at least one embodiment, the punctured sub-channel or the shortened sub-channel is determined based on an energy level quantity B and a mother code length in a symbol corresponding to the energy level quantity B.

In at least one embodiment, before demodulating and decoding the S symbols based on the symbol quantity S, the energy level quantity B, the reliability sequence, and the encoding sequence to obtain the L bits, the processing unit 1402 is further configured to perform de-interleaving processing on the S symbols.

In at least one embodiment, the processing unit 1402 is configured to sequentially map B bits included in each symbol in the S symbols to B sub-sequences sorted in ascending order of energy levels.

In at least one embodiment, for QAM256, the processing unit 1402 is further configured to exchange mapping orders of a third bit and a fourth bit included in each symbol in the S symbols.

In at least one embodiment, the encoding is polar code decoding.

In addition, as shown in FIG. 15, at least one embodiment further provides a communication apparatus 1500. For example, the communication apparatus 1500 is a chip or a chip system. Optionally, in at least one embodiment, the chip system includes a chip, or includes a chip and another discrete component.

The communication apparatus 1500 includes at least one processor 1510. The communication apparatus 1500 further includes at least one memory 1520, configured to: store a computer program, program instructions, and/or data. The memory 1520 is coupled to the processor 1510. The coupling in at least one embodiment is an indirect coupling or a communication connection between apparatuses, units, or modules in an electrical form, a mechanical form, or another form, and is used for information exchange between apparatuses, the units, or the modules. The processor 1510 operates in collaboration with the memory 1520. The processor 1510 executes the computer program stored in the memory 1520. Optionally, the at least one memory 1520 is also integrated with the processor 1510.

The communication apparatus 1500 further includes a transceiver 1530, and the communication apparatus 1500 exchanges information with another device by using the transceiver 1530. The transceiver 1530 is a circuit, a bus, a transceiver, or any other apparatus that is configured to exchange information.

In at least one embodiment, the communication apparatus 1500 is the foregoing transmitting end or the foregoing receiving end. The memory 1520 stores a computer program, program instructions, and/or data for implementing the functions in any one of the foregoing embodiments. The processor 1510 executes the computer program stored in the memory 1520, to complete the method in any one of the foregoing embodiments.

In at least one embodiment, a specific connection medium among the transceiver 1530, the processor 1510, and the memory 1520 is not limited. In at least one embodiment, the memory 1520, the processor 1510, and the transceiver 1530 are connected by using a bus in FIG. 15. The bus is represented by using a bold line in FIG. 15. A manner of connection between other components is merely an example for description, and cannot be construed as a limitation. The bus is classified into an address bus, a data bus, a control bus, and the like. For ease of representation, only one bold line is used for representing the bus in FIG. 15, but this does not mean that there is only one bus or only one type of bus. In at least one embodiment, the processor is a general-purpose processor, a digital signal processor, an application-specific integrated circuit, a field programmable gate array or another programmable logic device, a discrete gate or transistor logic device, or a discrete hardware component, and implements or perform the methods, steps, and logical block diagrams disclosed in at least one embodiment. The general-purpose processor is a microprocessor or any conventional processor or the like. The steps of the method disclosed with reference to at least one embodiment is directly performed by a hardware processor, or is performed by using a combination of hardware in the processor and a software module.

In at least one embodiment, the memory is a nonvolatile memory, for example, a hard disk drive (HDD) or a solid-state drive (SSD), or is a volatile memory such as a random access memory (RAM). The memory alternatively is any other medium that is configured to carry or store expected program code in a form of instructions or a data structure and that is accessed by a computer. This is not limited thereto. The memory in at least one embodiment alternatively is a circuit or any other apparatus that implements a storage function, and is configured to: store the computer program, the program instructions, and/or the data.

Figure 16:
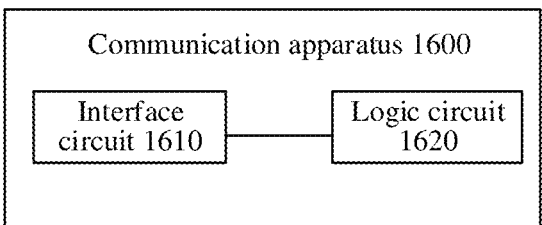
FIG. 16 is a schematic diagram of a structure of a third communication apparatus according to at least one embodiment.

Based on the foregoing embodiments, refer to FIG. 16. At least one embodiment further provides another communication apparatus 1600, including an interface circuit 1610 and a logic circuit 1620. The interface circuit 1610 is understood as an input/output interface, and is configured to perform operation steps the same as those of the input/output unit 1401 shown in FIG. 14 or the transceiver 1530 shown in FIG. 15. Details are not described herein again in at least one embodiment. The logic circuit 1620 is configured to run code instructions to perform the method in any one of the foregoing embodiments, is understood as the processing unit 1402 in FIG. 14 or the processor 1510 in FIG. 15, and implements a same function as the processing unit or the processor. Details are not described herein again.

Based on the foregoing embodiments, at least one embodiment further provides a readable storage medium. The readable storage medium stores instructions. In response to the instructions being executed, the encoding and decoding method in any one of the foregoing embodiments is implemented. The readable storage medium includes any medium that stores program code, such as a USB flash drive, a removable hard disk, a read-only memory, a random access memory, a magnetic disk, or a compact disc.

A person skilled in the art should understand that at least one embodiment is provided as a method, a system, or a computer program product. Therefore, at least one embodiment uses a form of hardware only embodiments, software only embodiments, or embodiments with a combination of software and hardware. In addition, at least one embodiment uses a form of a computer program product that is implemented on one or more computer-usable storage media (including but not limited to a disk memory, a CD-ROM, an optical memory, and the like) that include computer-usable program code.

At least one embodiment is described with reference to the flowcharts and/or block diagrams of the method, the apparatus (system), and the computer program product according to at least one embodiment. Computer program instructions are used to implement each process and/or each block in the flowcharts and/or the block diagrams and a combination of a process and/or a block in the flowcharts and/or the block diagrams. These computer program instructions is provided to a general-purpose computer, a dedicated computer, an embedded processor, or a processor of another programmable data processing apparatus to generate a machine, so that the instructions executed by the computer or the processor of the another programmable data processing apparatus generate an apparatus for implementing a function specified in one or more processes in the flowcharts and/or in one or more blocks in the block diagrams.

These computer program instructions is alternatively stored in a computer-readable memory that instructs a computer or another programmable data processing apparatus to work in a specific manner, so that the instructions stored in the computer-readable memory generate an artifact that includes an instruction apparatus. The instruction apparatus implements a function specified in one or more processes in the flowcharts and/or in one or more blocks in the block diagrams.

These computer program instructions is alternatively loaded onto a computer or another programmable data processing apparatus, so that a series of operations and steps are performed on the computer or the another programmable apparatus, to generate computer-implemented processing. Therefore, the instructions executed on the computer or the another programmable apparatus provide steps for implementing a function specified in one or more processes in the flowcharts and/or in one or more blocks in the block diagrams.

What is claimed is:

1. An encoding method, comprising:
obtaining an information bit quantity K and an encoding bit quantity L;
determining a symbol quantity S based on the encoding bit quantity L and an energy level quantity B, wherein S is S1 or S2, S1=L/B, and S2=L/2B;
determining K information sub-channels from an encoding sequence based on the symbol quantity S, the energy level quantity B, and a reliability sequence;
encoding K information bits and outputting a bit sequence based on the K information sub-channels; and
performing rate matching and modulation on the bit sequence to obtain S to-be-sent symbols, wherein
the encoding sequence includes Bmax sub-sequences, the Bmax sub-sequences respectively correspond to Bmax energy levels, each sub-sequence in the Bmax sub-sequences includes Smax sub-channels, and the reliability sequence indicates an order of reliability of sub-channels in the encoding sequence;
the K information sub-channels are selected from candidate sub-channels based on a descending order of reliability of the candidate sub-channels, and the candidate sub-channels are S1 sub-channels or 2×S2 sub-channels in a sub-sequence whose energy level is i; and
K, L, B, S, S1, S2, Bmax, and Smax are all positive integers, Smax is greater than or equal to S, Bmax is greater than or equal to B, and i is greater than or equal to 0 and less than B.

2. The method according to claim 1, wherein the determining the K information sub-channels includes selecting the K information sub-channels in the descending order of reliability from the sub-channels that are other than a punctured sub-channel, a shortened sub-channel, and a pre-frozen sub-channel and that are in the candidate sub-channels.

3. The method according to claim 2, wherein the
selecting the K information sub-channels in the descending order of reliability from the sub-channels that are other than the punctured sub-channel, the shortened sub-channel, and the pre-frozen sub-channel and that are in the candidate sub-channels includes determining the punctured sub-channel or the shortened sub-channel based on the energy level quantity B and a mother code length in a symbol corresponding to the energy level quantity B.

4. The method according to claim 1, wherein after the encoding the K information bits and outputting the bit sequence based on the K information sub-channels, the method further comprises:
performing interleaving processing on the S to-be-sent symbols.

5. The method according to claim 1, wherein the performing the rate matching and the modulation includes sequentially selecting one bit from each sub-sequence of B sub-sequences in an ascending order of energy levels and mapping the bit to one to-be-sent symbol.

6. The method according to claim 5, wherein for quadrature amplitude modulation QAM256, the modulation further includes: exchanging mapping orders of a bit selected from a sub-sequence corresponding to a third energy level and a bit selected from a sub-sequence corresponding to a fourth energy level in the ascending order of the energy levels.

7. The method according to claim 1, wherein the encoding the K information bits includes encoding the K information bits using polar code encoding.

8. A decoding method, comprising:
receiving S symbols formed using rate matching and modulation on a bit sequence, wherein a symbol quantity S is S1 or S2; and
demodulating and decoding the S symbols based on the symbol quantity S, an energy level quantity B, a reliability sequence, and an encoding sequence to obtain L bits, wherein the L bits includes K information bits, and L=S1×B, or L=2×S2×B;
determining K information sub-channels based on the symbol quantity S, the reliability sequence, and the encoding sequence, wherein the K information sub-channels correspond to the K information bits in the L bits; wherein
the encoding sequence includes Bmax sub-sequences, the Bmax sub-sequences respectively correspond to Bmax energy levels, each sub-sequence in the Bmax sub-sequences includes Smax sub-channels, and the reliability sequence indicates an order of reliability of sub-channels in the encoding sequence;
the K information sub-channels are selected from candidate sub-channels based on a descending order of reliability of the candidate sub-channels, and the candidate sub-channels are S1 sub-channels or 2×S2 sub-channels in a sub-sequence whose energy level is i; and K, L, B, S, S1, S2, Bmax, and Smax are all positive integers, Smax is greater than or equal to S, Bmax is greater than or equal to B, and i is greater than or equal to 0 and less than B.

9. The method according to claim 8, wherein the K information sub-channels are selected in the descending order of reliability from sub-channels that are other than a punctured sub-channel, a shortened sub-channel, and a pre-frozen sub-channel and that are in the candidate sub-channels.

10. The method according to claim 9, wherein the punctured sub-channel or the shortened sub-channel is determined based on an energy level quantity B and a mother code length in a symbol corresponding to the energy level quantity B.

11. The method according to claim 8, wherein before the demodulating and decoding the S symbols based on the symbol quantity S, the energy level quantity B, the reliability sequence, and the encoding sequence to obtain L bits, the method further comprises:

performing de-interleaving processing on the S symbols.

12. The method according to claim 11, wherein the demodulating the S symbols includes: sequentially mapping B bits in each symbol in the S symbols to B sub-sequences sorted in ascending order of energy levels.

13. The method according to claim 12, wherein for quadrature amplitude modulation QAM256, the demodulating the S symbols further includes exchanging mapping orders of a third bit and a fourth bit in each symbol in the S symbols.

14. The method according to claim 8, wherein the decoding the S symbols includes decoding the S symbols using polar code decoding.

15. A communication apparatus, comprising:

a memory configured to store a computer program; and at least one processor configured to execute the computer program stored in the memory to cause the at least one processor to:

obtain an information bit quantity K and an encoding bit quantity L;

determine a symbol quantity S based on the encoding bit quantity L and an energy level quantity B, wherein S is S1 or S2, S1=L/B, and S2=L/2B;

determine K information sub-channels from an encoding sequence based on the symbol quantity S, the energy level quantity B, and a reliability sequence;

encode K information bits and output a bit sequence based on the K information sub-channels; and perform rate matching and modulation on the bit sequence to obtain S to-be-sent symbols, wherein the encoding sequence includes Bmax sub-sequences, the Bmax sub-sequences respectively correspond to Bmax energy levels, each sub-sequence in the Bmax sub-sequences includes Smax sub-channels, and the reliability sequence indicates an order of reliability of sub-channels in the encoding sequence;

the K information sub-channels are selected from candidate sub-channels based on a descending order of reliability of the candidate sub-channels, and the candidate sub-channels are S1 sub-channels or 2×S2 sub-channels in a sub-sequence whose energy level is i; and K, L, B, S, S1, S2, Bmax, and Smax are all positive integers, Smax is greater than or equal to S, Bmax is greater than or equal to B, and i is greater than or equal to 0 and less than B.

16. The apparatus according to claim 15, wherein the K information sub-channels are selected in the descending order of reliability from the sub-channels that are other than a punctured sub-channel, a shortened sub-channel, and a pre-frozen sub-channel and that are in the candidate sub-channels.

17. The apparatus according to claim 16, wherein the punctured sub-channel or the shortened sub-channel is determined based on the energy level quantity B and a mother code length in a symbol corresponding to the energy level quantity B.

18. The apparatus according to claim 15, wherein after the encoding the K information bits and outputting the bit sequence based on the K information sub-channels, the at least one processor is further configured to:

perform interleaving processing on the S to-be-sent symbols.

19. The apparatus according to claim 15, wherein the at least one processor is configured to:

sequentially select one bit from each sub-sequence of B sub-sequences in an ascending order of energy levels and map the bit to one to-be-sent symbol.

20. The apparatus according to claim 19, wherein for quadrature amplitude modulation QAM256, the at least one processor is further configured to exchange mapping orders of a bit selected from a sub-sequence corresponding to a third energy level and a bit selected from a sub-sequence corresponding to a fourth energy level in the ascending order of the energy levels.

* * * * *